US011502138B2

(12) United States Patent
Tang et al.

(10) Patent No.: US 11,502,138 B2
(45) Date of Patent: Nov. 15, 2022

(54) ELECTRONIC SUBSTRATE, MANUFACTURING METHOD THEREOF, AND DISPLAY PANEL

(71) Applicants: Chengdu BOE Optoelectronics Technology Co., Ltd., Chengdu (CN); BOE TECHNOLOGY GROUP CO., LTD., Beijing (CN)

(72) Inventors: Guoqiang Tang, Beijing (CN); Yang Wang, Beijing (CN); Yuedi He, Beijing (CN)

(73) Assignees: Chengdu BOE Optoelectronics Technology Co., Ltd., Sichuan (CN); Beijing BOE Technology Development Co., Ltd., Beijing (CN)

(*) Notice: Subject to any disclaimer, the term of this patent is extended or adjusted under 35 U.S.C. 154(b) by 207 days.

(21) Appl. No.: 16/907,743

(22) Filed: Jun. 22, 2020

(65) Prior Publication Data
US 2020/0411608 A1 Dec. 31, 2020

(30) Foreign Application Priority Data
Jun. 27, 2019 (CN) .......................... 201910567976.X

(51) Int. Cl.
*H01L 27/32* (2006.01)
*G06F 3/044* (2006.01)
(Continued)

(52) U.S. Cl.
CPC .......... *H01L 27/3227* (2013.01); *G06F 3/044* (2013.01); *G06F 3/0412* (2013.01);
(Continued)

(58) Field of Classification Search
CPC ............. H01L 27/3227; H01L 27/3234; H01L 27/323; G06F 3/0412
See application file for complete search history.

(56) References Cited

U.S. PATENT DOCUMENTS 10,592,722 B2    3/2020  Xu et al.
11,222,930 B2 *  1/2022  Yuan ................... H01L 27/3227
(Continued)

FOREIGN PATENT DOCUMENTS

CN     104201187 A    12/2014
CN     104752462 A     7/2015
(Continued)

OTHER PUBLICATIONS

Machine translation, Li, Chinese Pat. Pub. No. CN-109933245-A, translation date: Mar. 12, 2022, Clarivate Analytics, all pages. (Year: 2022).*

(Continued)

*Primary Examiner* — Victoria K. Hall
(74) *Attorney, Agent, or Firm* — Collard & Roe, P.C.

(57) ABSTRACT

An electronic substrate, a manufacturing method thereof and a display panel are provided. The electronic substrate includes a base substrate as well as a photosensitive unit and a touch structure which are provided on the base substrate. The photosensitive unit includes a first electrode layer, and the touch structure includes a first touch electrode layer. The first electrode layer and the first touch electrode layer are in a same first conductive layer and made of a same material, and the first electrode layer and the first touch electrode layer insulated from each other.

15 Claims, 10 Drawing Sheets

(51) Int. Cl.
  *G06F 3/041* (2006.01)
  *H01L 51/56* (2006.01)
  *G06V 40/12* (2022.01)

(52) U.S. Cl.
  CPC .......... *G06F 3/0443* (2019.05); *G06F 3/0446* (2019.05); *G06V 40/12* (2022.01); *H01L 27/323* (2013.01); *H01L 27/3218* (2013.01); *H01L 27/3246* (2013.01); *H01L 27/3272* (2013.01); *H01L 51/56* (2013.01); *G06F 2203/04103* (2013.01); *G06F 2203/04111* (2013.01); *G06F 2203/04112* (2013.01); *H01L 2227/323* (2013.01)

(56) References Cited

U.S. PATENT DOCUMENTS

| | | | |
|---|---|---|---|
| 11,342,392 B2 * | 5/2022 | Tang | G06V 40/1318 |
| 2010/0213463 A1 * | 8/2010 | Park | G02F 1/1362 |
| | | | 257/E21.414 |
| 2013/0285046 A1 | 10/2013 | Yamazaki | |
| 2014/0049892 A1 * | 2/2014 | Huang | G06F 3/0446 |
| | | | 200/600 |
| 2015/0279884 A1 | 10/2015 | Kusumoto | |
| 2015/0364527 A1 | 12/2015 | Wang et al. | |
| 2016/0155782 A1 | 6/2016 | Sato | |
| 2016/0293100 A1 | 10/2016 | Zhang et al. | |
| 2017/0221971 A1 | 8/2017 | Shen et al. | |
| 2017/0357641 A1 | 12/2017 | Okamoto | |
| 2018/0060641 A1 | 3/2018 | Kim et al. | |
| 2018/0069068 A1 * | 3/2018 | Ka | H01L 51/50 |
| 2018/0074614 A1 | 3/2018 | Hiraga | |
| 2018/0239942 A1 | 8/2018 | Xu et al. | |
| 2019/0013368 A1 | 1/2019 | Chung et al. | |
| 2019/0073071 A1 | 3/2019 | Ryu et al. | |
| 2019/0087044 A1 * | 3/2019 | Cho | G06F 3/0412 |
| 2019/0237522 A1 | 8/2019 | Gao | |
| 2019/0251378 A1 * | 8/2019 | Jung | G06V 40/1306 |
| 2019/0384428 A1 | 12/2019 | Ahn et al. | |
| 2020/0133414 A1 * | 4/2020 | Lee | G06V 40/13 |
| 2020/0219455 A1 * | 7/2020 | Lius | H01L 27/3234 |
| 2020/0225828 A1 * | 7/2020 | Jeong | G09G 3/32 |
| 2020/0242324 A1 | 7/2020 | Li et al. | |
| 2020/0312928 A1 | 10/2020 | Chung et al. | |
| 2020/0350374 A1 | 11/2020 | Yuan et al. | |
| 2021/0057495 A1 * | 2/2021 | Yuan | H01L 27/3227 |
| 2021/0124441 A1 | 4/2021 | Ding et al. | |
| 2021/0134896 A1 | 5/2021 | Guo et al. | |
| 2021/0151524 A1 * | 5/2021 | Tang | G06F 3/0421 |
| 2021/0233962 A1 * | 7/2021 | Wang | G06F 3/0446 |
| 2022/0005891 A1 * | 1/2022 | Shu | G06F 3/0412 |

FOREIGN PATENT DOCUMENTS

| | | | | |
|---|---|---|---|---|
| CN | 106056099 A | 10/2016 | | |
| CN | 106775081 A | 5/2017 | | |
| CN | 107506728 A | 12/2017 | | |
| CN | 108596015 A | 9/2018 | | |
| CN | 109216421 A | 1/2019 | | |
| CN | 109378333 A | 2/2019 | | |
| CN | 109346498 A | * | 6/2019 | ........... H01L 27/288 |
| CN | 109933245 A | * | 6/2019 | ............. G06F 3/041 |
| CN | 109933246 A | * | 6/2019 | ............. G06F 3/041 |
| CN | 110214378 A | * | 9/2019 | ........... G06F 3/0412 |
| CN | 111312793 A | * | 6/2020 | ......... H01L 27/3227 |

OTHER PUBLICATIONS

Machine translation, Li, Chinese Pat. Pub. No. CN-109933246-A, translation date: Mar. 12, 2022, Clarivate Analytics, all pages. (Year: 2022).*

Machine translation, Ju, Chinese Pat. Pub. No. CN-111312793-A, translation date: Mar. 12, 2022, Clarivate Analytics, all pages. (Year: 2022).*

International Search Report in PCT/CN2019/084293 in Chinese, dated Jan. 23, 2020, with English Translation.

International Search Report in PCT/CN2019/090928 in Chinese, dated Sep. 27, 2019, with English Translation.

U.S. First Office Action in U.S. Appl. No. 16/620,572 dated May 17, 2021.

U.S. First Office Action in U.S. Appl. No. 16/759,197 dated Mar. 17, 2022.

* cited by examiner

ELECTRONIC SUBSTRATE, MANUFACTURING METHOD THEREOF, AND DISPLAY PANEL

CROSS REFERENCE TO RELATED APPLICATION

This application claims priority to Chinese Patent Application No. 201910567976.X, filed on Jun. 27, 2019, the entire disclosure of which is incorporated herein by reference as part of the present application.

TECHNICAL FIELD

Embodiments of the present disclosure relate to an electronic substrate, a manufacturing method thereof and a display panel.

BACKGROUND

With a development of science and technology, more and more functions are integrated in an electronic device, which facilitates people's lives greatly. For example, a user interface having a touch function is widely applied to various electronic devices. How to optimize a manufacturing process becomes a concern of people.

SUMMARY

Embodiments of the present disclosure provide an electronic substrate, comprising a base substrate as well as a photosensitive unit and a touch structure which are provided at the base substrate. The photosensitive unit comprises a first electrode layer, and the touch structure comprises a first touch electrode layer; the first electrode layer and the first touch electrode layer are in a same first conductive layer and made of a same material, and the first electrode layer and the first touch electrode layer are insulated from each other.

In some examples, the touch structure further comprises a second touch electrode layer in a different layer from the first conductive layer; and the photosensitive unit further comprises a second electrode layer, the second electrode layer is in a same layer and made of a same material as the second touch electrode layer, and the second electrode layer is insulated from the second touch electrode layer.

In some examples, the first touch electrode layer comprises a first touch electrode extended in a first direction and a plurality of second touch electrode portions arranged in a second direction; the second touch electrode layer comprises a plurality of second connecting portions, and the plurality of second connecting portions and the plurality of second touch electrode portions are alternately electrically connected to form a second touch electrode extended in the second direction; and the second direction intersects with the first direction.

In some examples, the photosensitive unit comprises a photosensitive thin film transistor and a first light shielding layer at a side of the photosensitive thin film transistor away from the base substrate, and the first light shielding layer is provided with a first opening at a position corresponding to the photosensitive thin film transistor; the photosensitive thin film transistor comprises a gate electrode, an active layer, a source electrode and a drain electrode, the gate electrode of the photosensitive thin film transistor is at a side of the active layer close to the base substrate, and the first opening at least partially overlaps with the active layer of the photosensitive thin film transistor in a direction perpendicular to the base substrate; and the first light shielding layer and the gate electrode of the photosensitive thin film transistor serve as the first electrode layer and second electrode layer respectively.

In some examples, the photosensitive thin film transistor further comprises an etch stopping layer at a side of the active layer away from the base substrate.

In some examples, the photosensitive unit further comprises a first capacitor comprising a first electrode and a second electrode; the first electrode of the first capacitor is in a same layer and made of a same material as the gate electrode of the photosensitive thin film transistor, and the first electrode of the first capacitor is insulated from the gate electrode of the photosensitive thin film transistor; and the second electrode of the first capacitor is in a same layer as and is electrically connected with the drain electrode of the photosensitive thin film transistor.

In some examples, the photosensitive unit comprises a photosensitive thin film transistor comprising a gate electrode, an active layer and a source-drain electrode layer, and the source-drain electrode layer and the gate electrode of the photosensitive thin film transistor serve as the first electrode layer and second electrode layer respectively.

In some examples, the photosensitive unit comprises a photosensitive element and a switching transistor which are connected with each other.

In some examples, the photosensitive element is at a side of the switching transistor away from the base substrate.

In some examples, the photosensitive element comprises a first electrode, a second electrode and a photosensitive layer located between the first and second electrodes, the switching transistor comprises a gate electrode, an active layer and a source-drain electrode layer, and the drain electrode of the switching transistor is electrically connected with the first electrode of the photosensitive element; and the first electrode of the photosensitive element and the gate electrode of the switching transistor serve as the first electrode layer and second electrode layer respectively.

In some examples, the electronic substrate further comprises a first light shielding layer, the first light shielding layer and the gate electrode of the switching transistor are at two opposite sides of the active layer of the switching transistor in the direction perpendicular to the base substrate respectively, and the first light shielding layer overlaps with the active layer of the switching transistor in the direction perpendicular to the base substrate.

In some examples, the electronic substrate further comprises a light-emitting element on the base substrate, and the photosensitive unit and the touch structure are both at a side of the light-emitting element away from the base substrate.

In some examples, the first touch electrode layer comprises a metal material as well as an opening to expose at least a part of the light-emitting element.

In some examples, the first touch electrode layer comprises a plurality of metal grids formed by a plurality of metal wires; and an orthographic projection of the first electrode layer at the base substrate is located within an orthographic projection of a mesh of one of the plurality of metal grids at the base substrate.

Embodiments of the present disclosure further provide a display panel comprising the above electronic substrate.

In some examples, the display panel further comprises a plurality of sub-pixels on the base substrate and arranged in an array in a first direction and a second direction, and the first direction is different from the second direction; and the photosensitive unit and the touch structure are both at a side of each of the plurality of sub-pixels away from the base substrate.

In some examples, the display panel further comprises a pixel defining layer, each of the plurality of sub-pixels comprises a light-emitting element, and the pixel defining layer comprises a plurality of openings for respectively exposing a plurality of light-emitting elements to define a plurality of pixel opening areas of the plurality of sub-pixels; and an orthographic projection of all conductive patterns in the first conductive layer at the base substrate is located outside orthographic projections of the plurality of pixel opening areas of the plurality of sub-pixels at the base substrate.

In some examples, the plurality of sub-pixels are distributed in a plurality of repeated units, and each of the plurality of repeated units comprises one red sub-pixel, one blue sub-pixel and two paired green sub-pixels; the pixel opening areas of the two paired green sub-pixels are arranged in parallel in the second direction; and an orthographic projection of the photosensitive unit at the base substrate is located between an orthographic projection of the opening area of the red sub-pixel at the base substrate and orthographic projections of the opening areas of the two paired green sub-pixels at the base substrate, and the orthographic projection of the opening area of the red sub-pixel is adjacent from the orthographic projections of the opening areas of the two paired green sub-pixels in the first direction.

Embodiments of the present disclosure further provide a manufacturing method of an electronic substrate, comprising: forming a photosensitive unit and a touch structure at a base substrate, wherein forming the photosensitive unit comprises forming a first electrode layer, and forming the touch structure comprises forming a first touch electrode layer; and the first electrode layer and the first touch electrode layer are formed in a same patterning process and are insulated from each other.

In some examples, forming the touch structure further comprises forming a second touch electrode layer, forming the photosensitive unit further comprises forming a second electrode layer, and the first electrode layer and the second touch electrode layer are formed in a same patterning process and are insulated from each other; and the manufacturing method further comprises forming a light-emitting element at the base substrate before formation of the photosensitive unit and the touch structure.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

Figure 1:
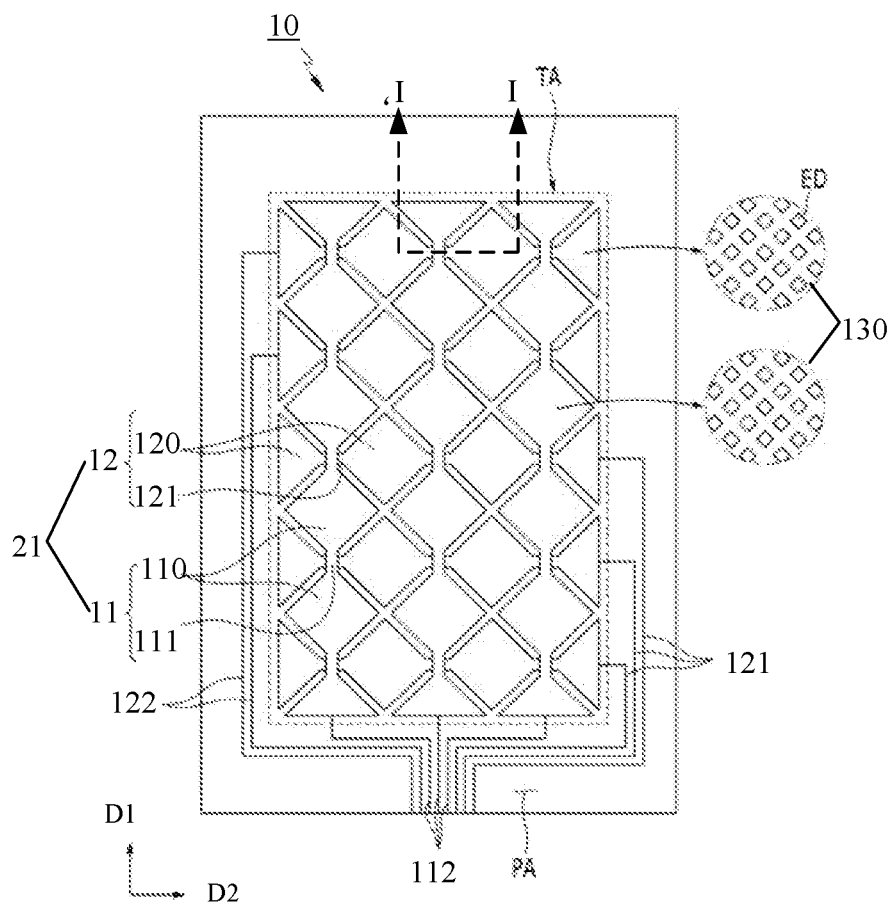
FIG. 1 is a schematic planar diagram of an electronic substrate according to some embodiments of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

Embodiments of the present disclosure provide an electronic substrate into which a photosensitive function (for example, a fingerprint image collection function) and a touch function are integrated, and at least one touch electrode layer in a touch structure is formed in the same layer as a conductive layer in a photosensitive unit, thereby saving technological steps and reducing an overall thickness of the substrate.

In some embodiments, the photosensitive unit with the photosensitive function is required to be used in cooperation with a light-emitting element, and light provided by the light-emitting element is used to illuminate an object, which is to be detected, to realize a photosensitive application (for example, the fingerprint image collection function or an optical touch function). For example, the light-emitting element is configured as an organic light-emitting element which, for example, belongs to a pixel of an organic light-emitting diode (OLED) display panel. When the photosensitive unit is integrated into the organic light-emitting diode (OLED) display panel, an organic light-emitting diode (OLED) for display function in the OLED display panel may be multiplexed as a light source to provide light for the photosensitive application.

For example, the display panel with the photosensitive function may have an add-on structure and a built-in structure. In the add-on structure, a photosensitive module is attached outside the display panel, for example, provided at a back side of the display panel, which requires additional fabrication of the photosensitive module and results in a final product with a large volume. In the built-in structure, the photosensitive module is integrated into the display panel, which may realize full-screen photosensitization, and since the structure is related to compatibility with a manufacturing technology of the display panel, how to manufacture a photosensitive module with a high signal-to-noise ratio and optimize the manufacturing technology is required to be considered.

For example, in the manufacturing technology of the organic light-emitting diode (OLED) display panel, in the case where the photosensitive unit is formed after the formation of the organic light-emitting element, a manufacturing technology of the photosensitive unit may affect the organic light-emitting element. For example, an organic material may be damaged by a photolithographic process in the manufacturing technology of the photosensitive unit, thereby affecting a product yield.

In the electronic substrate according to at least one embodiment of the present disclosure, at least one touch electrode in the touch structure is formed in the same patterning process as at least one conductive layer in the photosensitive unit, thus not only saving technological steps, but also reducing adverse effects caused by the manufacturing technology as many as possible.

For example, the touch structure in the electronic substrate according to at least one embodiment of the present disclosure is of a capacitance type, for example, a self-capacitance type or a mutual capacitance type; the touch structure may also be based on other touch principles.

The electronic substrate according to embodiments of the present disclosure is exemplarily illustrated with a touch structure based on a mutual capacitance principle as an example, which is not to be taken as limitation to the present disclosure.

Figure 2A:
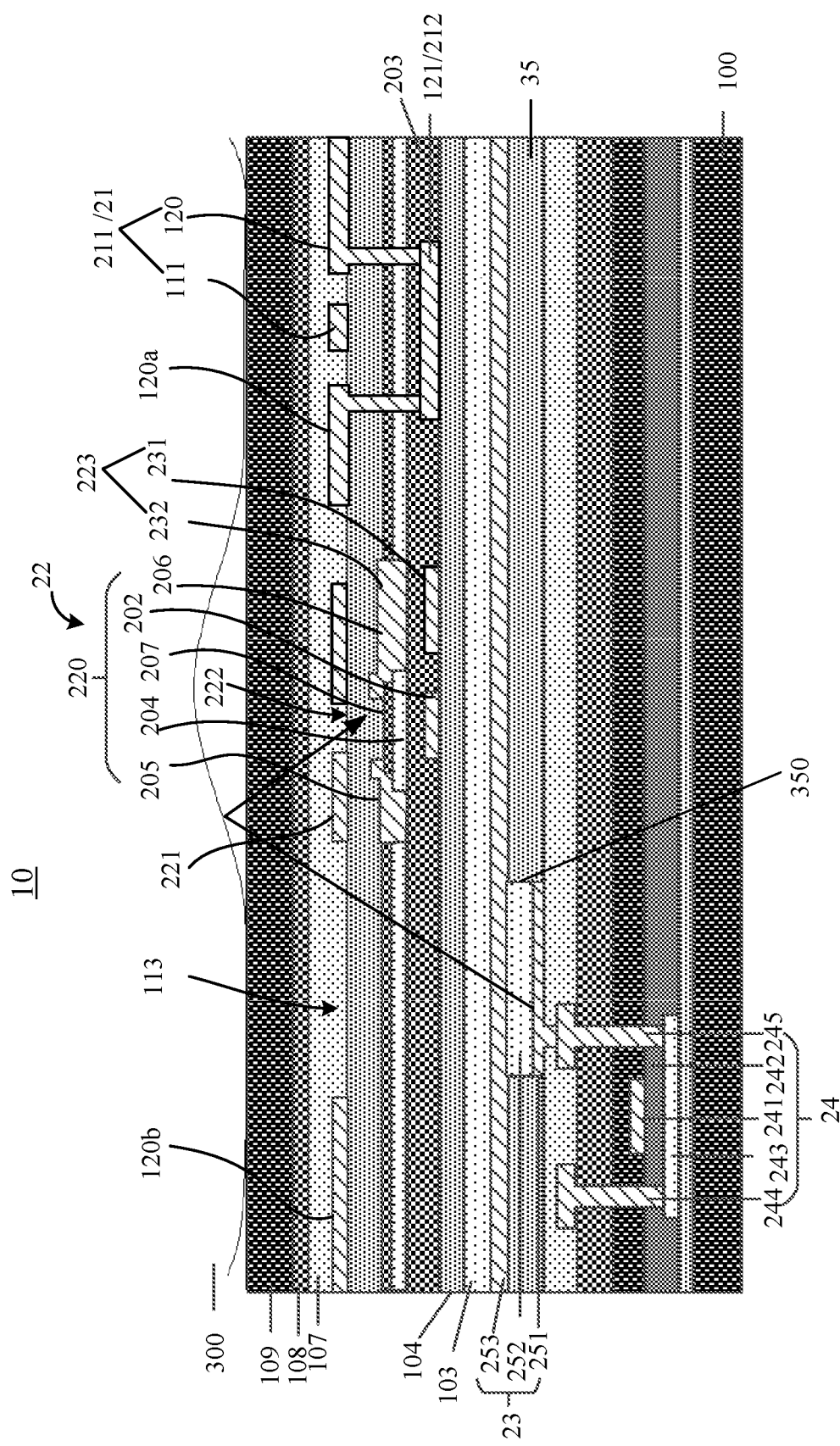
FIG. 2A is a first sectional view of the electronic substrate according to some embodiments of the present disclosure.

FIG. 1 is a schematic planar diagram of an electronic substrate according to embodiments of the present disclosure, and FIG. 2A shows an example of a sectional view of FIG. 1 along sectional line I-f. Referring to FIGS. 1 and 2A, the electronic substrate 10 includes a base substrate 100 as well as a photosensitive unit 22 and a touch structure 21 which are provided on the base substrate 100.

As shown in FIG. 1, the touch structure 21 includes a plurality of first touch electrodes 11 extended in a first direction D1 and a plurality of second touch electrodes 12 extended in a second direction D2. The first directions D1 and the second direction D2 intersect with each other, for example, are orthogonal to each other. Each first touch electrode 11 includes a first touch electrode portion 110 and a first connecting portion 111 which are connected alternately, and each second touch electrode 12 includes a second touch electrode portion 120 and a second connecting portion 121 which are connected alternately. The first and second connecting portions 111, 121 overlap with each other in a direction perpendicular to a surface of the base substrate 100. For example, the first and second touch electrodes 11, 12 are connected to an external touch circuit (not shown), for example, a touch chip, by a first touch wire 112 and a second touch wire 122 respectively.

The first and second touch electrode portions 110, 120 adjacent to each other may form mutual capacitance to sense a change in capacitance caused by a touch or an approach of an external object (for example, a finger of a user or a stylus), thereby sensing touch information, such as occurrence of the touch, a touch position, or the like. For example, the first and second touch electrodes 11, 12 are configured as a drive electrode and a sense electrode respectively, the first touch electrode 11 receives a touch drive signal (e.g. a row scanning signal) provided by the touch circuit through the first touch wire 112, an external touch causes a change in the mutual capacitance, a touch sense signal is generated at the second touch electrode 12 and transmitted to the touch circuit through the second touch wire 122, and the touch circuit obtains the touch information by means of analysis.

As shown in FIG. 1, the first and second touch electrodes 11, 12 may be provided in a touch sensing area TA in which the touch of the external object may be sensed. An area outside the touch sensing area TA serves as a non-sensing area PA. For example, the first and second touch wires 112, 122 are connected with the external touch circuit via the non-sensing area PA.

As shown in FIG. 2A, the first touch electrode 11 is in the same layer (i.e. a first conductive layer) as the second touch electrode portion 120 of the second touch electrode 12 to form a first touch electrode layer 211 of the touch structure 21; the second connecting portion 121 is in another layer (i.e. a second conductive layer) to form a second touch electrode layer 212 of the touch structure 21. The first and second touch electrode layers 211, 212 are separated by an insulating layer, and the second connecting portion 121 is electrically connected with the second touch electrode portion 120 through a via hole in the insulating layer to form the second touch electrode 12 in series. For example, the first touch electrode layer 211 is farther apart from the base substrate 100 than the second touch electrode layer 212, i.e., closer to the touch object (for example, the finger 300 of the user), such that the touch structure 21 is more sensitive to the change in the capacitance between the first and second touch electrode portions 110, 120 caused by the touch. However, embodiments of the present disclosure are not limited thereto.

For example, as shown in FIG. 2A, the electronic substrate 10 further includes a light-emitting element 23 on the base substrate 100, and the touch structure 21 and the photosensitive unit 22 are both provided at a side of the light-emitting element 23 apart from the base substrate 100. The photosensitive unit 22 is configured to sense light which is emitted by the light-emitting element 23 and reflected by the finger 300 at a surface of the electronic substrate, and convert the light signal into an electric signal which is collected through the touch wire, thus realizing collection of a fingerprint image used for a fingerprint identification function, or the like. In the present embodiment, the light-emitting element 23 is integrated into the electronic substrate 10; in some other embodiments, the light-emitting element may also be provided outside the electronic substrate, such as a backlight unit which is provided separately.

The photosensitive unit 22 includes a photosensitive element which, for example, may be implemented as a photodiode, a metal-semiconductor-metal type (MSM) photosensitive element or other types of photosensitive elements, such as a photosensitive thin film transistor, or the like. A type of the photosensitive element is not limited in the embodiments of the present disclosure.

For example, the fingerprint image is collected by the photosensitive unit; in a work process, as shown in FIG. 2A, light emitted by the light-emitting element 23 is reflected by the surface (fingerprint surface) of the finger 300, then received by the photosensitive element in the photosensitive unit 22 and converted into an electric signal. Since a fingerprint valley (concave surface) and a fingerprint ridge (convex surface) of the finger 300 have different light reflectivities, light with different intensities is reflected, thereby generating electric signals with different magnitudes at different positions of the finger. The photosensitive units 22 at different positions send the obtained electric signals to an external processing circuit (for example, a fingerprint processing chip, for example, a processing circuit 224 in FIG. 2C) for analysis, so as to obtain the fingerprint image of the surface of the finger 300, which is further used for fingerprint identification. For example, the plurality of photosensitive units 22 receive the light reflected by corresponding areas of the corresponding finger 300 respectively to collect fingerprint images of the corresponding areas, which are then spliced into a complete fingerprint image.

FIG. 2A shows an example in which the photosensitive element is configured as a photosensitive thin film transistor 220. For example, the photosensitive thin film transistor 220 includes a gate electrode 202, a gate insulating layer 203, an active layer 204 and a source-drain electrode layer (including a source electrode 205 and a drain electrode 206) which are stacked at the base substrate 100 sequentially. The gate electrode 202 of the photosensitive thin film transistor 220 is closer to the base substrate 100 than the active layer 204. That is, the photosensitive thin film transistor 200 has a bottom-gate structure which prevents the active layer from being shielded by the gate electrode and facilitates an increase in a photosensitive area of the photosensitive thin film transistor and improvement on a detection sensitivity of the photosensitive thin film transistor.

For example, the photosensitive thin film transistor 220 may further include an etch stopping layer 207 provided above the active layer 204, and the etch stopping layer 207 may protect a surface of the active layer from being damaged in an etching technology of the source-drain electrode layer. The etch stopping layer 207 is made of, for example, an inorganic insulating material, such as silicon oxide, silicon nitride, or an organic material such as a photoresist material.

A type and a structure of the photosensitive thin film transistor 220 are not limited in the embodiments of the present disclosure. For example, the thin film transistor 220 may be configured as a p-type transistor or an n-type transistor. For example, in at least one embodiment, the photosensitive thin film transistor 220 may also have a vertical transistor structure with a vertical channel with respect to the base substrate 100. That is, a channel direction from the source electrode to the drain electrode is perpendicular to the surface of the base substrate 100. Due to the vertical channel structure, the photosensitive thin film transistor 220 may have a photosensitive area and a channel length which are independent from each other, which enables the photosensitive thin film transistor 220 to have both a large photosensitive area and a short channel length, thereby increasing a photoresponse and a signal-to-noise ratio of the photosensitive unit 22.

For example, the active layer 204 is made of a photosensitive semiconductor material which may generate photo-generated carriers under illumination and also generate charges under an action of a gate electric field, and therefore, the photosensitive thin film transistor has both the photosensitive function and a switching function. For example, the active layer 204 is made of an organic semiconductor material, such as poly(3-hexylthiophene) (P3HT) which is an organic material having both photosensitivity and semiconductor properties, and in order to improve the photosensitivity of the P3HT material, [6,6]-phenyl carbon 61-methyl butyrate (PCBM) may be doped therein to form the active layer 204 made of a mixed material of P3HT and PCBM.

For example, as shown in FIG. 2A, the photosensitive unit 22 further includes a first light shielding layer 221 located at a side of the photosensitive thin film transistor 220 apart from the base substrate 100, and the first light shielding layer 221 is provided with a first opening 222 at a position corresponding to the photosensitive thin film transistor 220, and the first opening 222 overlaps with the active layer of the photosensitive thin film transistor 220 in a direction perpendicular to the base substrate 100, so as to allow the active layer of the photosensitive thin film transistor 220 to receive the reflected light to be detected through the first opening 222. The first opening 222 is configured to shield wide-angle stray light to improve induction accuracy of the photosensitive thin film transistor 220. For example, an optical path (including a reflection angle, or the like) of the light is predetermined according to a relative position between the light-emitting element 23 and the photosensitive thin film transistor 220, and the reflected light at an overlarge angle may be shielded by the first light shielding layer 221. For example, the first light shielding layer 221 is made of a conductive material (such as a metal material), a black resin material, or the like. For example, an orthographic projection of the first opening 222 at the base substrate is located between an orthographic projection of the source electrode of the photosensitive thin film transistor at the base substrate and an orthographic projection of the drain electrode of the photosensitive thin film transistor at the base substrate.

For example, a size of the first opening 222 should not be too large, otherwise an effect of reflecting the stray light may not be achieved; the size should also not be too small, otherwise photosensitivity is reduced due to insufficient exposure of the photosensitive thin film transistor 220. For example, the first opening 222 has an average size (side length or diameter) ranging from 1 micron to 15 microns, for example, from about 1.5 microns to about 3.5 microns.

For example, as shown in FIG. 2A, when the first light shielding layer 221 is made of a conductive material, the first touch electrode layer 211 is provided at the same layer as the first light shielding layer 221, and the second touch electrode layer 212 is provided at the same layer as the gate electrode 202 of the photosensitive thin film transistor 220. Since the first light shielding layer 221 has a simple pattern and is not used for signal transmission (for example, in a floating state), the arrangement of the first touch electrode layer 211 including the first touch electrode 11 and the second touch electrode portion 120 at the same layer as the conductive layer not only facilitates wiring, but also reduces crosstalk between electric signals. In some other examples, the first light shielding layer 221 may serve as a part of the first touch electrode layer 211, for example, a part of the first touch electrode 11 or the second touch electrode portion 120. That is, a part of the first touch electrode layer 211 doubles as the first light shielding layer 221. In other examples, the first light shielding layer 211 may also be configured as a floating electrode.

In this case, as shown in FIG. 2A, the second touch electrode portion 120 is electrically connected with the second connecting portion 121 through the via hole penetrating through the etch stopping layer 207 and the gate insulating layer 203.

In some other embodiments, the first touch electrode layer 211 is provided at the same layer as the first light shielding layer 221, and the second touch electrode layer 212 may be provided at the same layer as and insulated from the source-drain electrode layer of the photosensitive thin film transistor 220.

Figure 2B:
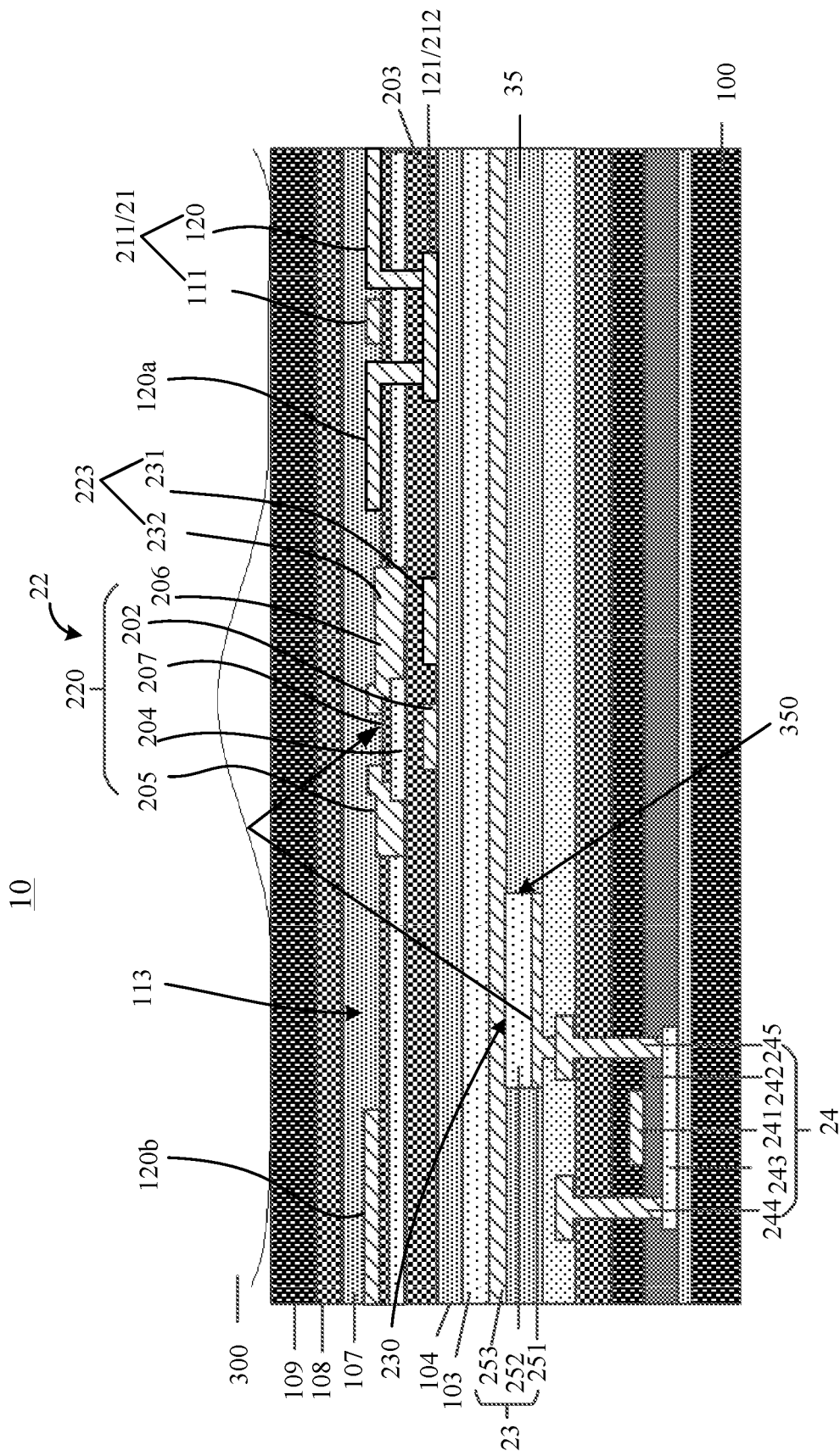
FIG. 2B is a second sectional view of the electronic substrate according to some embodiments of the present disclosure.

In still other embodiments, as shown in FIG. 2B, the first and second touch electrode layers 211, 212 may be provided at the same layer as and insulated from the source-drain electrode layer and the gate electrode 202 of the photosensitive thin film transistor 220 respectively.

For example, the first and second touch electrode layers 211, 212 may be made of a metal material, for example, a metal, such as gold (Au), silver (Ag), copper (Cu), aluminum (Al), molybdenum (Mo), magnesium (Mg), tungsten (W), or the like, and an alloy material of any combination thereof. These materials may reduce a resistance of the conductive layer (gate electrode and/or source electrode, drain electrode) in the photosensitive thin film transistor at the same layer as the first and/or second touch electrode layer(s) 221, 222, which is helpful to improve the sensitivity of the photosensitive thin film transistor.

For example, the first touch electrode layer 211 includes an opening to expose at least a part of the light-emitting element 23; for example, the first touch electrode layer 211 includes a grid structure, and each light-emitting element 23 is located in a corresponding mesh of the grid structure to be exposed.

Referring to FIGS. 1 and 2A, each of the first and second touch electrode portions 110, 120 includes a grid structure 130 formed by a plurality of metal wires, and at least a part of the light-emitting element (ED) 23 is exposed by a mesh 113 of the grid structure 130, such that the light emitted by the light-emitting element 23 reaches the touch finger 300 without being blocked by the first touch electrode layer 211. FIG. 2A shows the mesh 113 between a first part 120a and a second part 120b of the second touch electrode portion 120, and as shown, the photosensitive element (photosensitive thin film transistor 220) is also exposed by the mesh 113 so as to smoothly receive the light reflected by the finger 300. For example, the mesh 113 has an average size (diameter or side length) of about 25 microns. For example, a light-emitting area of the light-emitting element 23 has an average size of about 15 microns; a photosensitive area of the photosensitive unit 22 has an average size of about 10 microns.

In some other examples, the first and second touch electrode layers 211, 212 may also be made of a transparent conductive material, for example, a transparent conductive metal oxide, such as indium tin oxide (ITO), indium zinc oxide (IZO), zinc oxide (ZnO), zinc aluminum oxide (AZO), or the like.

For example, the photosensitive unit 22 further includes a first capacitor 223 including a first electrode 231 and a second electrode 232. For example, as shown in FIG. 2A, the first electrode 231 is provided at the same layer as and insulated from the gate electrode 202 of the photosensitive thin film transistor 220, and the second electrode 232 is provided at the same layer as and is electrically connected with the drain electrode 206 of the photosensitive thin film transistor 220. For example, the second electrode 232 and the drain electrode 206 of the photosensitive thin film transistor 220 are integrally formed.

Figure 2C:
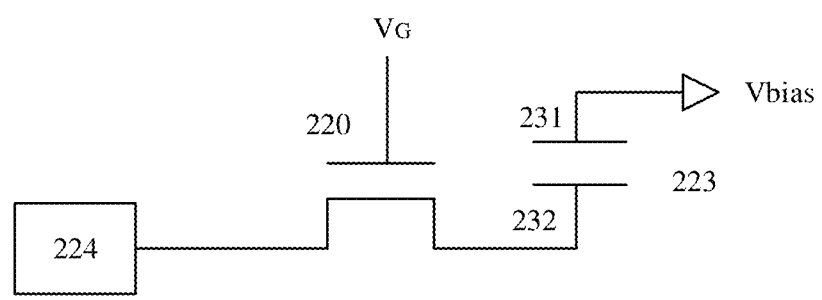
FIG. 2C is a first schematic diagram of a photosensitive circuit according to some embodiments of the present disclosure.

In one example, the first capacitor 223 and the photosensitive thin film transistor 220 form a photosensitive circuit as shown in FIG. 2C. The drain electrode 206 of the photosensitive thin film transistor 220 is electrically connected with the second electrode 232 of the first capacitor 223, and the source electrode 205 of the photosensitive thin film transistor 220 is electrically connected with the processing circuit 224. The gate electrode 202 of the photosensitive thin film transistor 220 is connected with a control signal VG through a scanning signal line. The first electrode 231 of the first capacitor 223 may be loaded with a bias voltage Vbias, for example, grounded.

The above-mentioned photosensitive circuit has a working process as follows.

In a reset stage, the control signal VG is an on signal, the photosensitive thin film transistor 220 is turned on, and the processing circuit 224 writes a reset signal into the first capacitor 223 through the photosensitive thin film transistor 220 to reset the first capacitor 223.

In a photosensitive stage, the control signal VG is an off signal, the photosensitive thin film transistor 220 is turned off, the active layer 204 generates photo-generated carriers under illumination of reflected light, and the processing circuit 224 applies a bias voltage to the source electrode 205 of the photosensitive thin film transistor 220, such that an electric field is generated between the source electrode 205 and the drain electrode 206 of the photosensitive thin film transistor 220, and under the action of the electric field, the photo-generated carriers are transmitted and accumulated at the second electrode 232 of the first capacitor 223 to charge the first capacitor 223, thus generating a data voltage Vdata at the second electrode 232.

In a detection stage, the control signal VG is an on signal, the photosensitive thin film transistor 220 is turned on, and the processing circuit 224 reads the data voltage Vdata stored in the first capacitor from the photosensitive thin film transistor 220 and then analyzes the data voltage Vdata to form a fingerprint image. The fingerprint image may be used for a corresponding application, such as system unlocking, mobile payment, or the like. For example, the processing circuit 224 may be configured as a digital signal processor (DSP), a central processing unit, or the like, and may further include a storage device as required. Implementation of the above-mentioned processing circuit is not limited in the embodiments of the present disclosure.

In the above-mentioned photosensitive circuit, since the photosensitive thin film transistor 220 has both the photosensitive and switching functions, compared with a conventional photosensitive circuit, a switching control circuit may be omitted, and a design of the circuit is simplified. Certainly, implementation of the photosensitive circuit is not limited in the embodiments of the present disclosure.

For example, the light-emitting element 23 includes a first electrode 251, a light-emitting layer 252 and a second electrode 253. One of the first and second electrodes 251, 253 serves as an anode, and the other serves as a cathode; for example, the first electrode 251 serves as the anode, and the second electrode 253 serves as the cathode. For example, the light-emitting layer 252 is configured as an organic light-emitting layer or a quantum dot light-emitting layer. For example, the light-emitting element 23 may include a hole injection layer, a hole transport layer, an electron injection layer, an electron transport layer, or the like, in addition to the light-emitting layer 252. For example, the light-emitting layer 253 may be made of a high molecular light-emitting material, a low molecular light-emitting material, or the like, when configured as an organic light-emitting layer. The light-emitting element 23 has a top emission structure, the first electrode 251 has reflectivity, and the second electrode 253 has transmissivity or semi-transmissivity. For example, the first electrode 251 is made of a material with a high work function to serve as the anode, and for example, has an ITO/Ag/ITO laminated structure; the second electrode 253 is made of a material with a low work function to serve as a cathode, for example, a semi-transmissive metal or metal alloy material, such as an Ag/Mg alloy material.

For example, the electronic substrate 10 further includes a drive circuit of the light-emitting element 23. For clarity, FIG. 2A only shows a first transistor 24 electrically connected with the light-emitting element 23 directly, and the first transistor 24 may be configured as a driving transistor to work in a saturation state and control a magnitude of a current for driving the light-emitting element 23 to emit light. For example, the first transistor 24 may be also configured as a light-emitting control transistor, and may be configured to control a flow of the current for driving the light-emitting element to emit light. A type of the first transistor is not limited in the embodiments of the present disclosure.

The first transistor 24 includes a gate electrode 241, a gate insulating layer 242, an active layer 243, a source electrode 244 and a drain electrode 245, and the drain electrode 245 is electrically connected with the first electrode 251 of the light-emitting element 23. A type, a material and a structure of the first transistor 24 are not limited in the embodiments of the present disclosure, and for example, the first transistor 24 may be of a top gate type, a bottom gate type, or the like. The active layer 243 of the first transistor 24 may be made of amorphous silicon, polycrystalline silicon (low temperature polycrystalline silicon and high temperature polycrystalline silicon), an oxide semiconductor (for example, IGZO), or the like, and the first transistor 24 may be of an N type or a P type.

It should be noted that the source and drain electrodes of the transistor adopted in the embodiments of the present disclosure may have a symmetrical structure, such that no difference exists between the structures of the source and drain electrodes, and thus, the source and drain electrodes may be interchanged as required.

For example, the electronic substrate 10 further includes a first encapsulation layer 103 located between the light-emitting element 23 and the photosensitive unit 22, and the encapsulation layer 103 is configured to seal the light-emitting element 23 to prevent penetration of external moisture and oxygen into the light-emitting element and the drive circuit from damaging to a device, such as the light-emitting element 23, or the like. For example, the first encapsulation layer 103 includes an organic thin film or a structure in which an organic thin film and an inorganic thin film are stacked alternately.

For example, the electronic substrate 10 further includes a passivation layer 104 located between the first encapsulation layer 103 and the photosensitive unit 22. For example, the passivation layer 104 is configured as an inorganic insulating layer, and the gate electrode 202 of the photosensitive thin film transistor 220 and the second connecting portion 121 in the touch structure 21 are located on the passivation layer 104 and are in contact with the passivation layer 104. Compared with an organic insulating material, a conductive material has a higher adhesive force to an inorganic insulating material, and thus is not prone to fall off. For example, the passivation layer 104 may be made of silicon nitride, silicon oxide or silicon oxynitride. For example, the passivation layer 104 may also include a structure in which a silicon oxide layer and a silicon nitride layer are stacked alternately.

For example, the electronic substrate 20 may further include a second encapsulation layer 107 and a cover plate 109 which are located above the photosensitive unit 22 and the touch structure 21, and the second encapsulation layer 107 is configured to protect the devices located below. The second encapsulation layer 107 is made of, for example, an inorganic insulating material, such as silicon oxide, silicon nitride, or the like. The cover plate 109 is configured as a glass cover plate, for example.

For example, the electronic substrate 10 may also be integrated with a display substrate. For example, the display substrate is configured as an organic light-emitting diode (OLED) display substrate. For example, the light-emitting element 23 may double as an organic light-emitting element (OLED) in a sub-pixel of the display substrate, and the drive circuit of the light-emitting element 23 may double as a pixel drive circuit of the organic light-emitting elements in the display substrate. That is, the light of the light-emitting element 23 may be used for displaying a picture to achieve a display function of the display substrate and performing detection to achieve the photosensitive function of the photosensitive element.

For example, as shown in FIG. 2A, in a case where the display function is integrated into the electronic substrate, the electronic substrate 10 may further include a polarizing layer 108 located between the cover plate 109 and the second encapsulation layer 107. For example, the polarizing layer 108 includes a circular polarizer. The circular polarizer includes a linear polarizing layer and a quarter-wave plate which are stacked, and an angle of 45 degrees is formed between an axis of the quarter-wave plate and a polarizing axis of the linear polarizing layer. Therefore, when passing through the circular polarizer, external light is converted into circular polarization light, the circular polarization light is reflected by the electrode in the electronic substrate and then converted into linear polarization light when passing through the quarter-wave plate for the second time, but at this point, the linear polarization light has a polarization direction different from the polarization axis of the linear polarization layer by 90 degrees, and is thus unable to pass through the linear polarization layer. Therefore, the polarizing layer 108 may absorb the external light emitted to the electronic substrate, thereby reducing interference of ambient light and increasing contrast of a displayed image of the electronic substrate 10.

Figure 3A:
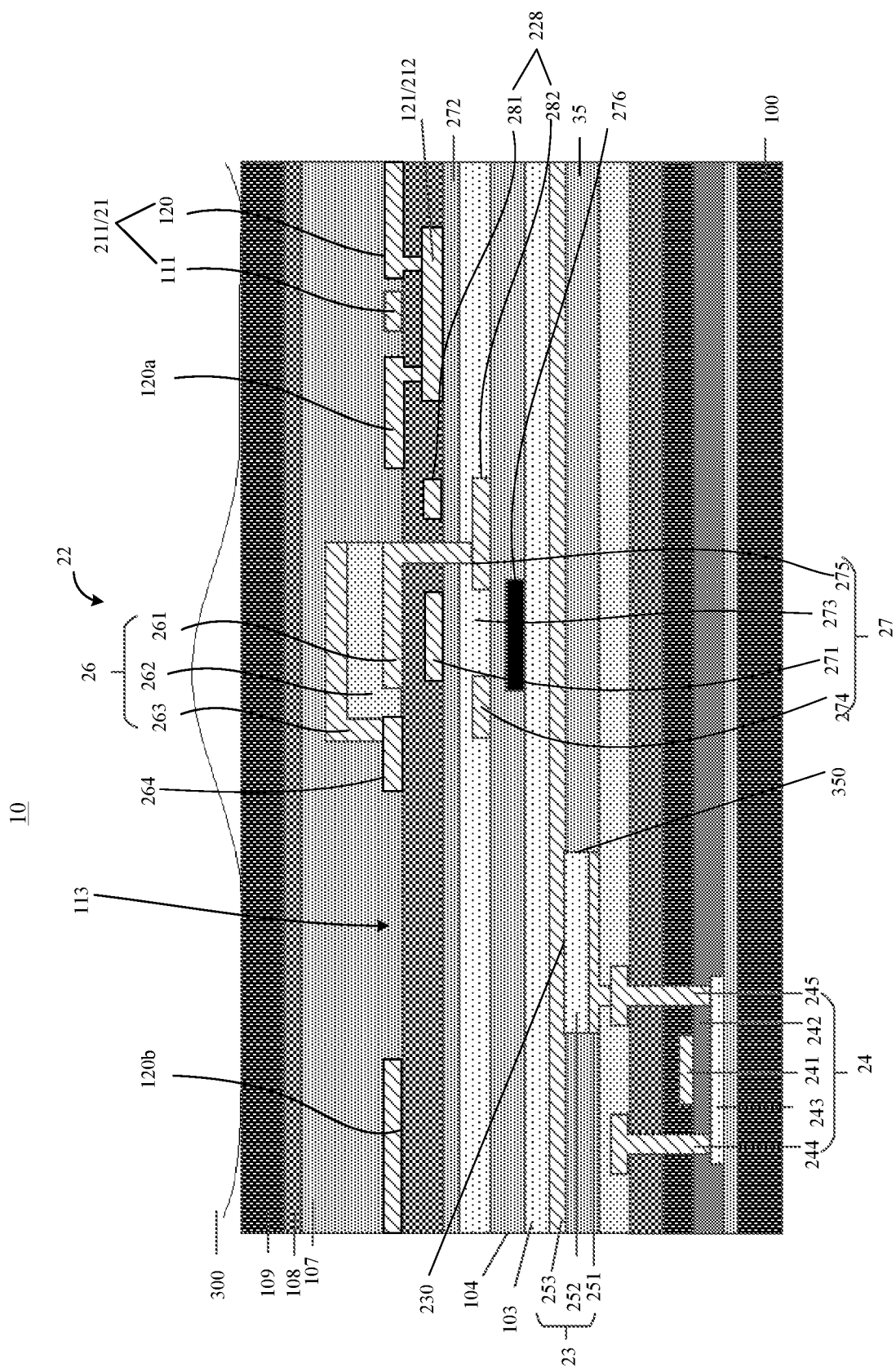
FIG. 3A is a third sectional view of the electronic substrate according to some embodiments of the present disclosure.

FIG. 3A is a schematic sectional diagram of the electronic substrate according to another embodiment of the present disclosure. As shown in FIG. 3A, the photosensitive element is implemented as a photodiode 26, and in this case, the photosensitive unit 22 may further include a switching transistor 27 electrically connected with the photodiode 26. For example, the photodiode 26 is located at a side of the switching transistor 27 apart from the base substrate. The switching transistor 27 is configured to control signal (e.g. a voltage signal) transmission between the photosensitive element and an external processing circuit.

The photodiode 26 includes a first electrode (first pole) 261, a second electrode (second pole) 263 and an optical detection layer 262 located between the first and second electrode 261, 263. One of the first and second electrode 261, 263 serves as a cathode, and the other serves as an anode. For example, the first electrode 261 serves as the cathode, and the second electrode 263 serves as the anode. For example, the optical detection layer 262 may be implemented as a PN junction or a PIN junction to form a PN-type photodiode or a PIN-type photodiode.

The switching transistor 27 includes a gate electrode 271, a gate insulating layer 272, an active layer 273 and a source-drain electrode layer (including a source electrode 274 and a drain electrode 275). A type, a material and a structure of the switching transistor 27 are not limited in the embodiments of the present disclosure. For example, the structure may be of a top gate type, a bottom gate type, a double-gate type, or the like, and the active layer 273 of the switching transistor 27 may be made of, for example, an organic material or an inorganic material, for example, an organic semiconductor material, such as PBTTT (poly(2,5-bis(3-alkylthiophene-2-yl)thieno[3,2-b]thiophene)), PDBT-co-TT, PDQT, PDVT-10, dinaphtho-thieno[3,2-b]thiophene (DNTT), pentacene, or the like. For example, the switching transistor 27 may be of an N-type or a P-type. For example, the drain electrode 275 of the switching transistor 27 is electrically connected with the first electrode 261 of the photodiode 26.

For example, as shown in FIG. 3A, the switching transistor 27 has a top-gate structure in which the gate electrode 271 of the switching transistor 27 may serve as a light shielding layer of the active layer 273 to prevent an influence on a performance of the switching transistor 27 due to an adverse effect of stray light above the active layer 273 on the active layer 273.

As shown in FIG. 3A, the first touch electrode layer 211 is provided in the same layer as the first electrode 261 of the photodiode 26, and the second touch electrode layer 212 is provided in the same layer as the gate electrode 271 of the switching transistor 27. Since the first electrode 261 of the photodiode 26 has a simple pattern, the arrangement of the first touch electrode layer 211 including the first touch electrode 11 and the second touch electrode portion 120 at the same layer as the conductive layer may facilitate wiring and reduce crosstalk between signals.

Figure 3B:
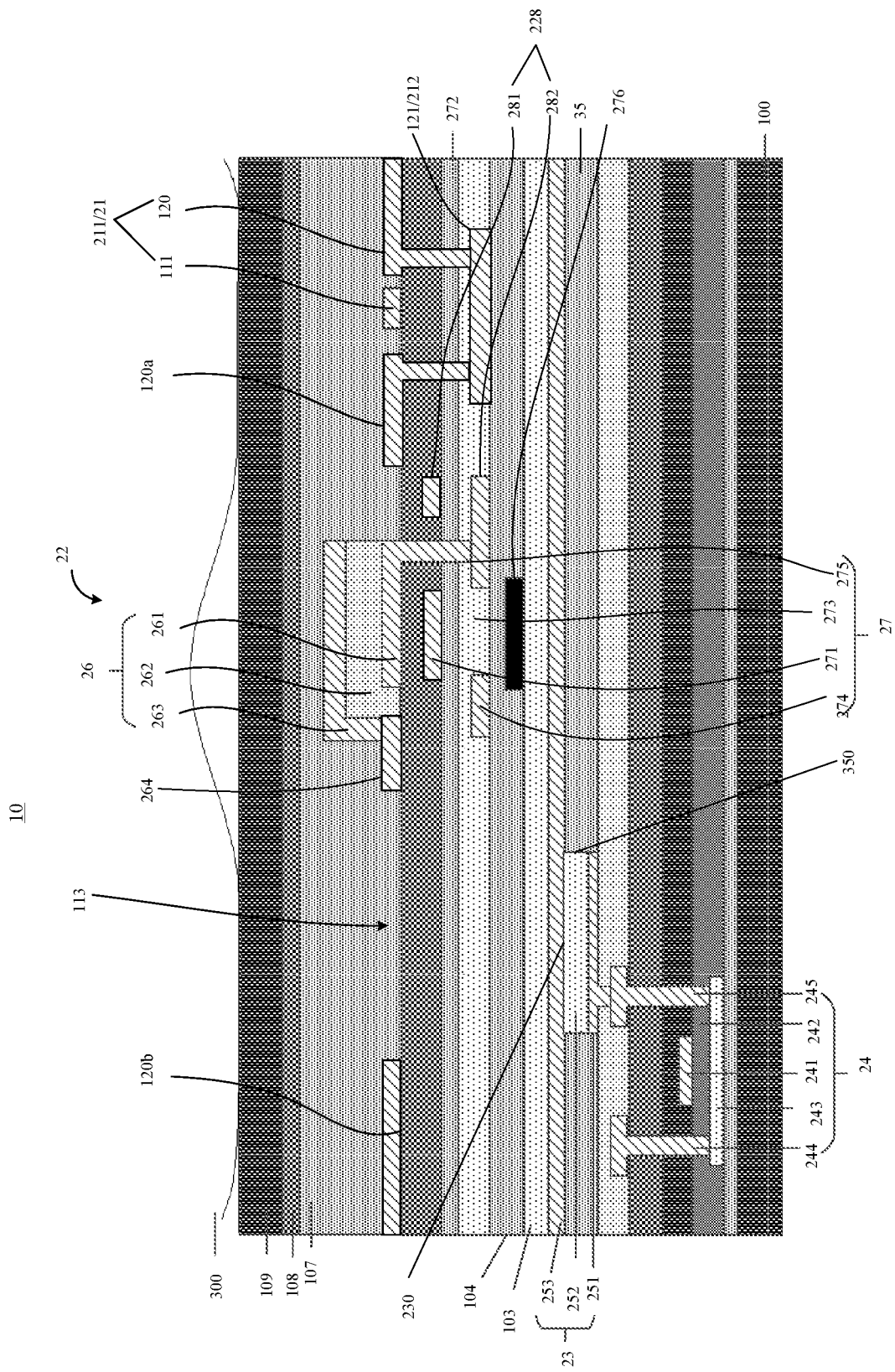
FIG. 3B is a fourth sectional view of the electronic substrate according to some embodiments of the present disclosure.

In some other examples, as shown in FIG. 3B, the first touch electrode layer 211 is provided at the same layer as the first electrode 261 of the photodiode 26, and the second touch electrode layer 212 may be provided at the same layer as the source-drain electrode layer of the switching transistor 27.

For example, the electronic substrate 10 further includes a second light shielding layer 276, the second light shielding layer 276 and the gate electrode 271 of the switching transistor 27 are located at two opposite sides of the active layer 273 of the switching transistor 27 in the direction perpendicular to the base substrate 100 respectively, and the second light shielding layer 276 overlaps with the active layer 273 of the switching transistor 27 in the direction perpendicular to the base substrate 100, and is configured to reduce light illumination of the active layer 273 of the switching transistor 27. In such an arrangement, the active layer 273 is shielded from light by the gate electrode 271 of the switching transistor 27 and the second light shielding layer at the same time, thereby further avoiding deterioration in performance of a thin film transistor device due to light illumination. For example, in the direction perpendicular to the base substrate 100, the second light shielding layer 276 overlaps with both the source and drain electrodes 274, 275 of the switching transistor 27, thereby completely shielding a channel area between the source and drain electrodes 274, 275. For example, as shown in FIG. 3A, the second light shielding layer 276 is provided between the light-emitting element 23 and the switching transistor 27, and may reduce illumination of the active layer of the switching transistor 27 by the light emitted from the light-emitting element 23. The second light shielding layer 276 may protect the switching transistor 27 to avoid deterioration in performance of a device caused by light illumination. For example, the second light shielding layer 276 is made of a black organic material, for example, an organic material for forming a black matrix. In some examples, the second light shielding layer 276 may be made of a black resin material, a polyimide (PI) material in which carbon black particles are doped, or an inorganic oxide material having a dark color.

Similarly, the photosensitive unit 22 may also include a second capacitor 228 including a first electrode 281 and a second electrode 282. As shown in FIG. 3A, the first electrode 281 of the second capacitor is provided at the same layer as and insulated from the gate electrode 271 of the switching transistor 27, and the second electrode 282 is provided at the same layer as and electrically connected with the drain electrode 275 of the switching transistor. For example, the second electrode 282 and the drain electrode 275 of the switching transistor 27 are integrally formed.

Figure 3C:
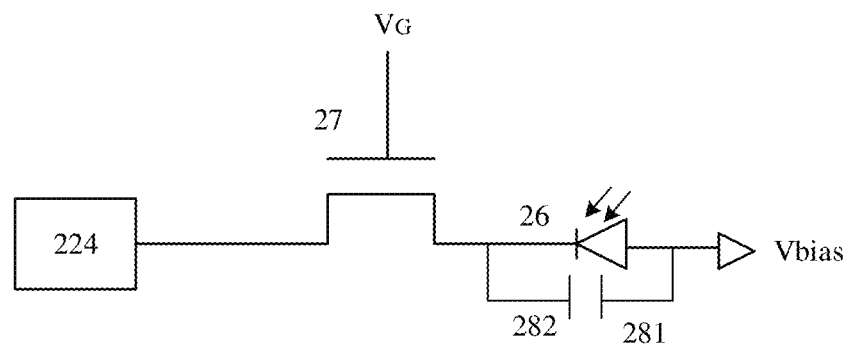
FIG. 3C is a second schematic diagram of the photosensitive circuit according to some embodiments of the present disclosure.

In one example, the second capacitor 228, the switching transistor 27 and the photodiode 26 form a photosensitive circuit as shown in FIG. 3C. In the photosensitive circuit, the cathode (corresponding to the first electrode 261) of the photodiode 26 is electrically connected with the drain electrode 275 of the switching transistor 27, and the anode (corresponding to the second electrode 263) of the photodiode 26 is connected with a bias voltage Vbias to enable the photodiode 26 to work in a reverse bias state, for example, to be grounded. The second electrode 282 of the second capacitor 228 is electrically connected with the drain electrode 275 of the switching transistor 27; the first electrode 281 of the second capacitor 228 may be connected with a fixed potential, for example, electrically connected with the anode of the photodiode 26. The source electrode 274 of the switching transistor 27 is electrically connected with the processing circuit 224, and the gate electrode 271 is configured to receive a control signal VG.

The above-mentioned photosensitive circuit has a working process as follows.

In a reset stage, the control signal VG is an on signal, the switching transistor 27 is turned on, and the processing circuit 224 writes a reset signal into the second capacitor 228 through the switching transistor 27 to reset the second capacitor 228. In a photosensitive stage, the control signal VG is an off signal, and the switching transistor 26 is turned off, generates photo-generated carriers under illumination of the reflected light and charges the second capacitor 228, such that the second capacitor 228 generates and stores a data voltage Vdata. In a detection stage, the control signal VG is an on signal, the switching transistor 26 is turned on, and the processing circuit 224 reads the data voltage Vdata stored in the second capacitor 228 through the switching transistor 26 and then analyzes the data voltage Vdata to form a fingerprint image.

As shown in FIG. 3A, the electronic substrate 10 further includes a first lead 264 which is provided in the same layer as and is insulated from the first electrode 261 of the photodiode 26. The first lead 264 is configured to be electrically connected with the second electrode 263 of the photodiode 26 to lead the second electrode 263 to other conductive layers for convenient wiring. For example, as shown in FIG. 3A, the second electrode 263 directly overlaps with the first lead 264 to form electric connection. Since the photodiode 26 is provided in a spacing area between the light-emitting elements, and the space occupied by the second electrode 263 of the photodiode 26 is limited, the second electrode 263 of the photodiode 26 is led out by providing the first lead, thereby saving the occupied area of the second electrode 263.

For example, the first electrode 261 of the photodiode 26 is made of a metal; similarly, the first touch electrode layer 211 at the same layer as the first electrode 261 includes a grid structure to expose the light-emitting element 23, which is described with reference to the embodiment in FIG. 2A and not repeated herein. The second electrode 263 of the photodiode 26 is made of a transparent conductive material, for example, a transparent conductive metal oxide, such as indium tin oxide (ITO), indium zinc oxide (IZO), zinc oxide (ZnO), zinc aluminum oxide (AZO), or the like.

For example, the optical detection layer 262 of the photodiode 26 is made of an organic photosensitive material, such as poly(3-hexylthiophene) (P3HT); in order to improve the photosensitivity of the P3HT material, [6,6]-phenyl carbon 61-methyl butyrate (PCBM) may be doped therein to form the optical detection layer 262 made of a mixed material of P3HT and PCBM.

It should be noted that "provided in the same layer" or "located in the same layer" in the embodiments of the present disclosure means that a plurality of structures are obtained by performing a same patterning process on a same thin film layer and thus located in the same layer.

Figure 4A:
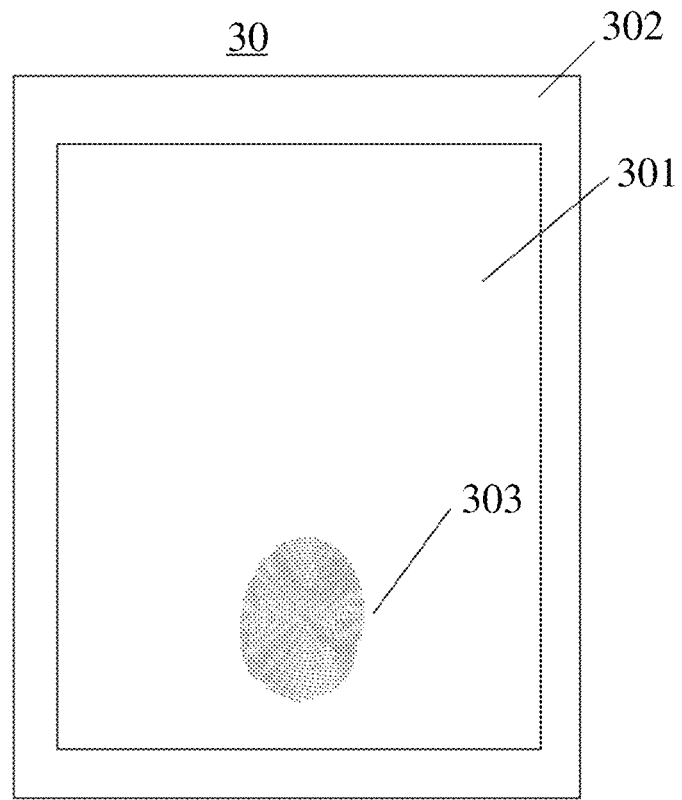
FIG. 4A is a schematic diagram of a display panel according to some embodiments of the present disclosure.

At least one embodiment of the present disclosure further provides a display panel which includes the above-mentioned electronic substrate 10, and a display function, a touch function and a photosensitive function (for example, fingerprint identification) are integrated into the display panel. As shown in FIG. 4A, the display panel 30 includes a display area 301 and a non-display area 302. For example, the display area 301 may be the same as or different from the touch sensing area TA of the electronic substrate 10.

For example, a fingerprint identification area 303 is included in the display area 301 and may be configured as a part or all of the display area 301.

For example, the display panel 30 is configured as an organic light-emitting diode display panel, and includes a plurality of sub-pixels arranged in an array, and each sub-pixel includes an organic light-emitting element (organic light-emitting diode OLED) and a pixel drive circuit for driving the organic light-emitting element to emit light. For example, the organic light-emitting element in each sub-pixel emits red light, green light or blue light. For example, the organic light-emitting element doubles as the above-mentioned light-emitting element 23, and the pixel drive circuit doubles as the drive circuit of the above-mentioned light-emitting element 23.

Compared with a case where the photosensitive unit 22 is integrated into the pixel drive circuit, the photosensitive unit 22 is closer to the cover plate 109, that is, closer to the finger 300 to be detected, such that the photosensitive unit 22 is shielded less by other layer structures and has higher exposure and photosensitivity.

In such a structure, since the organic light-emitting element is formed in advance, the manufacturing technology of the photosensitive unit 22 and the touch structure 21 which are formed thereafter may have an adverse effect on the organic light-emitting element. For example, the organic material may be damaged by a photolithography technology in the manufacturing technology, thereby affecting the yield of the display panel. However, in the display panel according to at least one embodiment of the present disclosure, the touch electrode in the touch structure is formed in the same patterning process as the conductive layer in the photosensitive unit, which not only saves technological steps, but also reduces adverse effects caused by the manufacturing technology as many as possible.

For example, as shown in FIG. 2A, when the electronic substrate is applied to the display panel, the display panel may further include a pixel defining layer 35 located on the first electrode of the light-emitting element 23, and in this situation, the light-emitting element 23 serves as a light-emitting element for display in the display panel. The pixel defining layer 35 includes an opening 350 therein to expose at least a part of the first electrode 251 of the light-emitting element 23, so as to define a pixel opening area (i.e., an effective light-emitting area) 230 of each sub-pixel of the display substrate. The light-emitting layer 252 of the light-emitting device 23 is formed at least in the opening 350 (the light-emitting layer 252 may also cover a part of a surface of the pixel defining layer apart from the first electrode of the light-emitting element), and the second electrode 253 is formed at the light-emitting layer 252 to form the light-emitting element 23. For example, the second electrode 253 serves as a common electrode with an entire surface provided in the electronic substrate 10. For example, the first electrode 251 serves as the anode of the light-emitting element, and the second electrode 253 serves as the cathode of the light-emitting element.

For example, when the first and second conductive layers include a metal or an alloy material, orthographic projections of conductive patterns (including the electrodes in the touch structure and the photosensitive unit) in the first and second conductive layers at the base substrate 100 are all located outside orthographic projections of the plurality of pixel opening areas 230 of the plurality of sub-pixels at the base substrate 100, that is, fall within orthographic projections of pixel separation areas between the pixel opening areas at the base substrate 100, and the pixel separation area serves as a non-opening area of the pixel defining layer 35, thereby preventing light from being shielded which causes a decrease of a pixel opening ratio caused when the light is shielded by the metal. The pixel separation area is configured to separate the pixel opening areas of the plurality of sub-pixels and separate the light-emitting layers of the sub-pixels, so as to prevent a cross color.

For example, as shown in FIG. 2A, each of the first touch electrode portion 110, the first connecting portion 111, the second touch electrode portion 120 and the second connecting portion 121 includes the grid structure 130, and at least one pixel opening area 230 is exposed by the mesh 113 of the grid structure 130 (that is, an orthogonal projection of the mesh 113 at the base substrate 100 covers an orthogonal projection of the at least one pixel opening area 230 at the base substrate), and for example, the mesh is polygonal, such as quadrangular, pentagonal, hexagonal, or the like.

Figure 4B:
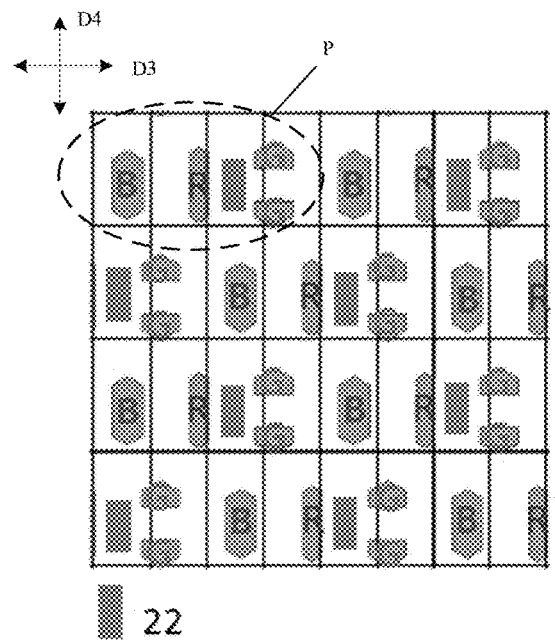
FIG. 4B is a schematic diagram of an arrangement of pixels in the display panel according to some embodiments of the present disclosure.

The arrangement of the sub-pixels in the display panel is not limited in the embodiments of the present disclosure. FIG. 4B shows a pixel arrangement view of the display panel. For example, the sub-pixels may form a pixel unit in a sub-pixel sharing manner (for example, pentile) to realize full-color display. In some other examples, the sub-pixels may be arranged in a stripe type, a mosaic type, a delta type or other sub-pixel rendering (SPR) manners. The arrangement of the sub-pixels is not limited in the embodiments of the present disclosure.

For example, the sub-pixels having the color with insensitive position resolutions can be shared between different pixels using a difference in the resolution of different-color sub-pixels by the human eye. Since the human eye is most sensitive to green, each red sub-pixel and each blue sub-pixel may be shared by at least two pixel units, and each pixel unit may have one green sub-pixel independently, for example.

A plurality of pixel (RGB) opening areas 230 of a plurality of sub-pixels are shown with polygons in FIG. 4B schematically. For example, a frame line in FIG. 4B may schematically represent a signal line (for example, a gate line, a data line, a power line, or the like) defining a plurality of pixel areas, which is not limited in the embodiments of the present disclosure. In some other examples, the frame line is only used for schematically marking a plurality of pixel areas, and does not necessarily indicate an actual structure. For example, as shown in FIG. 4B, pixel circuits of the plurality of sub-pixels are arranged in an array in a third direction D3 and a fourth direction D4 which are different. For example, the third direction D3 is the same as either of the above-mentioned first and second directions D1, D2, and the fourth direction D4 is the same as the other.

In the third direction D3, the pixel opening areas of the red and blue sub-pixels are arranged alternately; the pixel opening areas of the green sub-pixels are arranged in parallel in pairs in the fourth direction and located between the pixel opening areas of the red and blue sub-pixels in the third direction.

For example, the plurality of sub-pixels are distributed in a plurality of repeated units P, each of which includes one red sub-pixel, one blue sub-pixel and two paired green sub-pixels, the four sub-pixels may form two virtual pixels, and the red and blue sub-pixels in the repeated unit are shared by the two virtual pixels respectively. The sub-pixels in the plurality of repeated units form a pixel array, and a sub-pixel density is 1.5 times a virtual pixel density in a row direction (for example, the third direction D3) of the pixel array and 1.5 times the virtual pixel density in a column direction (for example, the fourth direction D4) of the pixel array. Such a pixel arrangement may increase the pixel density compared to a traditional RGB arrangement.

Since each pixel unit has one green sub-pixel independently, the green sub-pixel has a highest density, and the opening area of the green sub-pixel is set to be relatively small, so as to realize high-density pixel distribution.

As shown in FIG. 4B, the photosensitive unit 22 is provided in the spacing area between the adjacent opening areas 230 of sub-pixels (R, G, B) (that is, provided corresponding to the pixel separation area of the pixel defining layer), so as to avoid shielding the light emitted by the light-emitting element 23.

For example, as shown in FIG. 4B, the photosensitive unit 22 is provided adjacent to the pixel (G) emitting green light; for example, an orthographic projection of the photosensitive unit 22 at the base substrate is located between an orthographic projection of the opening area of the red sub-pixel at the base substrate and orthographic projections of the opening areas of the paired green sub-pixels at the base substrate in the third direction. The photosensitive unit 22 is configured to induce the light of the pixel emitting green light. That is, the OLED emitting green light doubles as the light-emitting element 23. Such an arrangement may reduce an influence of the multiplexing of the light-emitting element on the display function due to a long service life and a high emitting efficiency of the green OLED.

For example, each paired green OLEDs may be provided with one photosensitive unit, thus improving photosensitive precision of the display panel 30, for example, obtaining the fingerprint image with a high resolution.

In some other embodiments, the display panel may also be configured as a liquid crystal display panel, which is not limited in the embodiments of the present disclosure.

At least one embodiment of the present disclosure provides a display device including the above-mentioned electronic substrate or display panel. For example, the display device may be configured as a product or component with any display function, such as a digital photo frame, a smart bracelet, a smart watch, a mobile phone, a tablet computer, a display, a notebook computer, a navigator, or the like.

At least one embodiment of the present disclosure further provides a manufacturing method of the above-mentioned electronic substrate, which at least includes: forming a photosensitive unit and a touch structure at a base substrate; forming the photosensitive unit includes forming a first electrode layer, forming the touch structure includes forming a first touch electrode layer, and the first electrode layer is formed at the same layer as the first touch electrode layer.

It should be noted that "formed at the same layer" in the embodiments of the present disclosure means that a plurality of structures are formed from the same thin film layer with the same patterning process and thus have the same material.

Figure 5:
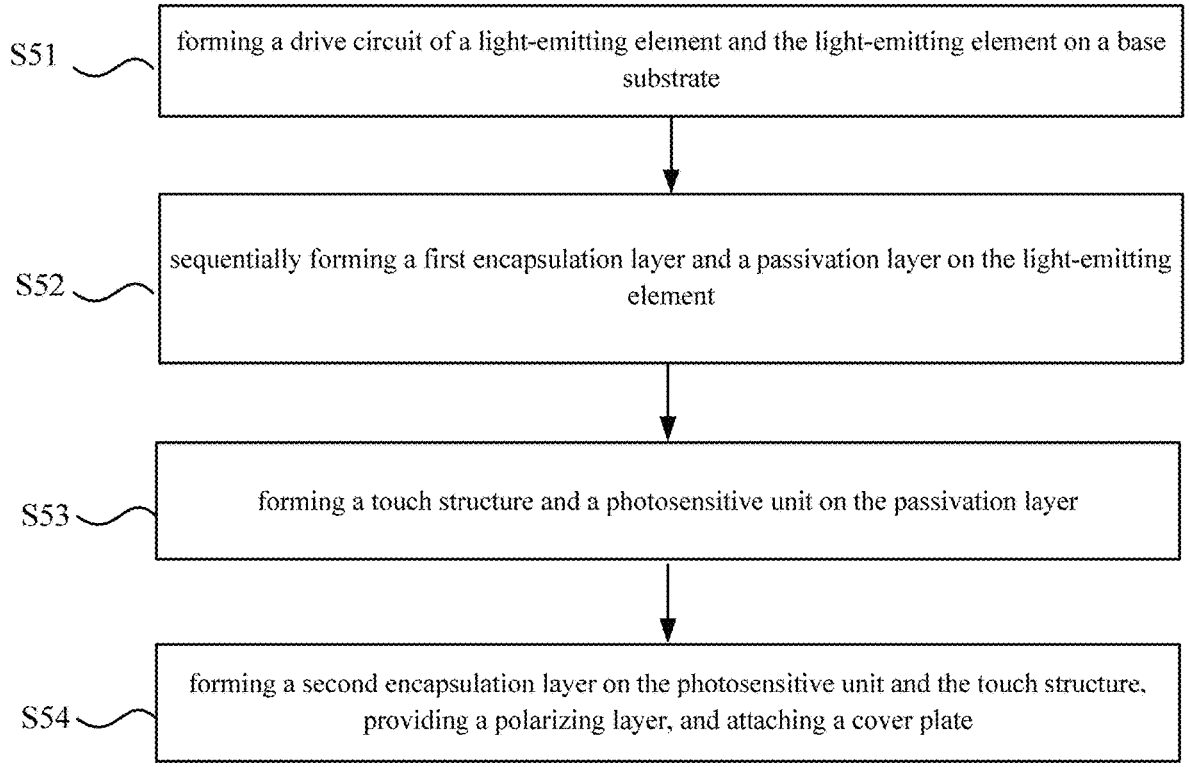
FIG. 5 is a first flow chart of a manufacturing method of the electronic substrate according to some embodiments of the present disclosure.

FIG. 5 is a flowchart of a manufacturing method of an array substrate according to at least one embodiment of the present disclosure, and the manufacturing method of the electronic substrate according to this embodiment will be exemplarily described below with reference to FIGS. 1, 2A-2B and 3A-3B.

As shown in FIG. 5, the manufacturing method includes the following steps S51-S54.

Step S51: forming the drive circuit of the light-emitting element 23 and the light-emitting element 23 at the base substrate 100.

For example, as shown in FIG. 2A, forming the drive circuit includes forming the first transistor 24, for example, includes sequentially forming the active layer 243, the gate insulating layer 242, the gate electrode 241, an interlayer insulating layer and the source-drain electrode layer (including the source electrode 244 and the drain electrode 245) of the first transistor 24 at the base substrate 100.

For example, the active layer 243 may be made of an elementary semiconductor material or a compound semiconductor material, such as amorphous silicon, polycrystalline silicon (low-temperature polycrystalline silicon or high-temperature polycrystalline silicon), a metal oxide semiconductor (for example, IGZO, AZO), or the like.

For example, the gate electrode 241 and the source-drain electrode layer may be made of gold (Au), silver (Ag), copper (Cu), aluminum (Al), molybdenum (Mo), magnesium (Mg), tungsten (W), an alloy material of any combination thereof, or a conductive metal oxide material, such as indium tin oxide (ITO), indium zinc oxide (IZO), zinc oxide (ZnO), zinc aluminum oxide (AZO), or the like.

For example, the gate and interlayer insulating layers 242 may have a single-layer structure of silicon nitride or silicon oxide or a multi-layer structure formed by stacking silicon nitride and silicon oxide.

For example, the above-mentioned conductive material layer may be formed with a physical vapor deposition technology, such as sputtering, or the like, and the above-mentioned insulating material layer may be formed with a chemical vapor deposition technology, or the like.

For example, as shown in FIG. 2A, forming the light-emitting element 23 includes sequentially forming the first electrode 251, the light-emitting layer 252 and the second electrode 253.

For example, the first electrode 251 may be formed with the physical vapor deposition (for example, sputtering) technology, and the light-emitting layer 252 and the second electrode 253 may be formed with an evaporation technology. For example, the first electrode 251 is made of a material with a high work function to serve as an anode, and for example, has an ITO/Ag/ITO laminated structure; the second electrode 253 is made of a material with a low work function to serve as a cathode, for example, a semi-transmissive metal or metal alloy material, such as an Ag/Mg alloy material.

Step S52: sequentially forming the first encapsulation layer 103 and the passivation layer 104 at the light-emitting element 25.

For example, the first encapsulation layer 103 is made of a resin-type organic material, and formed with a coating technology, for example.

For example, the passivation layer 104 is made of an inorganic material, such as silicon nitride, silicon oxide, or silicon oxynitride; for example, the passivation layer 104 is formed of an inorganic material with the chemical vapor deposition technology.

For example, in the embodiments shown in FIGS. 3A and 3B, the second light shielding layer 276 is also required to be formed at the first encapsulation layer 103 before formation of the passivation layer 104.

Step S53: forming the touch structure 21 and the photosensitive unit 22 at the passivation layer 104.

Figure 6A:
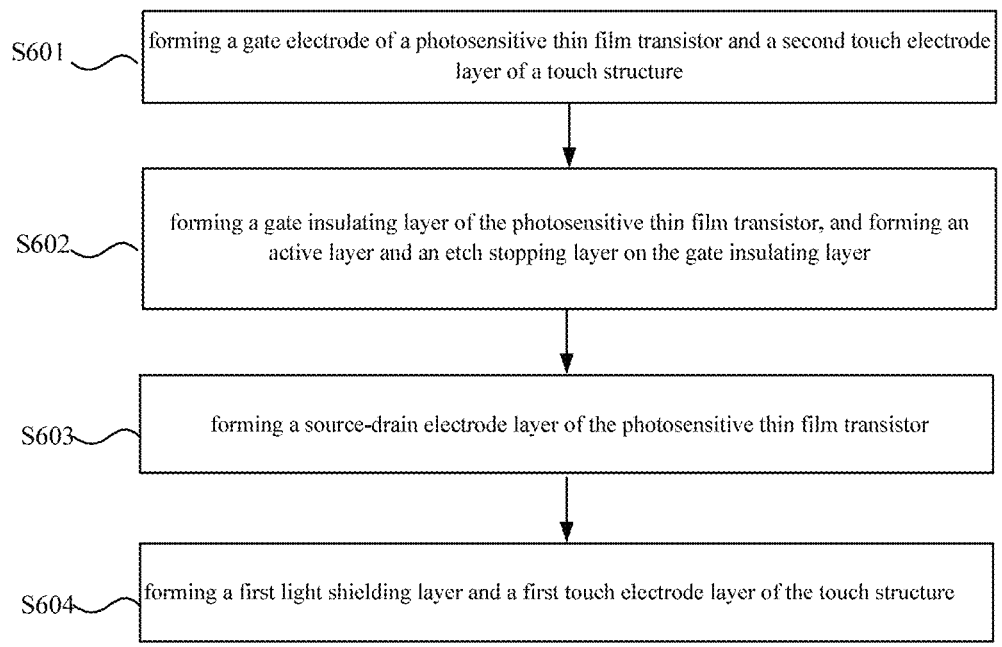
FIG. 6A is a second flow chart of the manufacturing method of the electronic substrate according to some embodiments of the present disclosure.
Figure 6B:
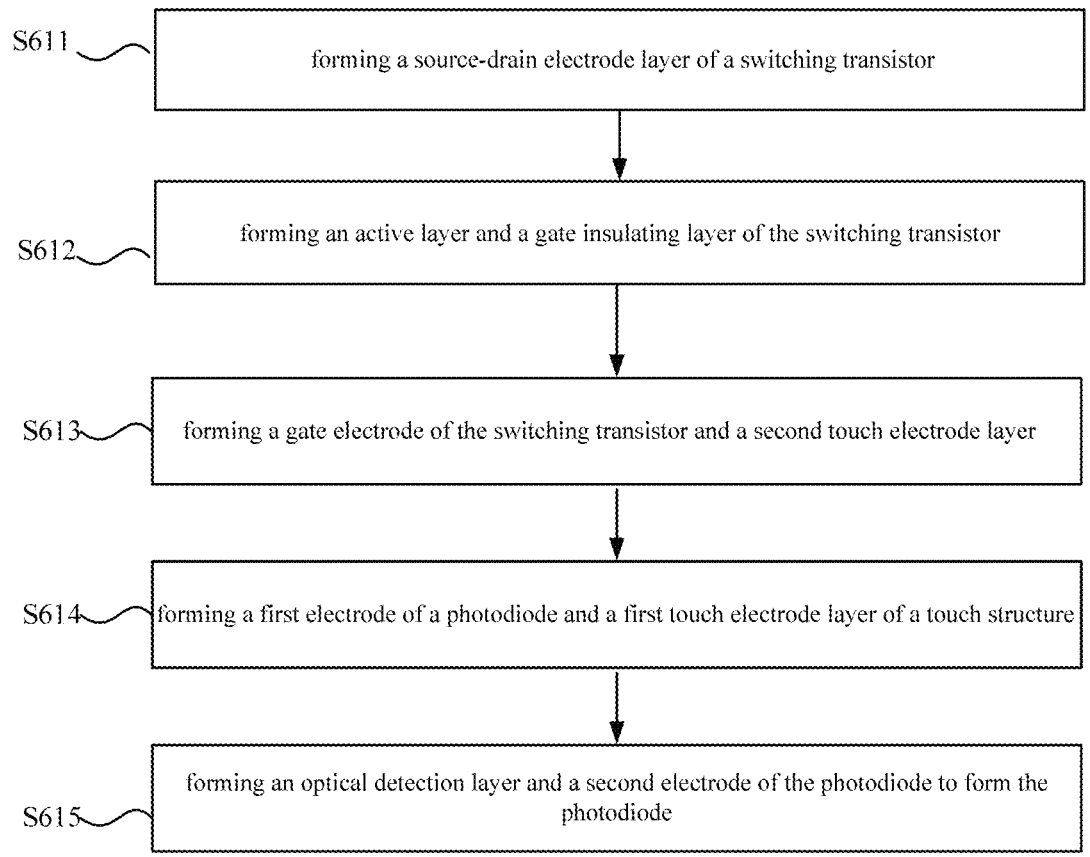
FIG. 6B is a third flow chart of the manufacturing method of the electronic substrate according to some embodiments of the present disclosure.

FIGS. 6A and 6B show specific flowcharts of step S53 corresponding to structures of the electronic substrate shown in FIGS. 2A-2B and 3A-3B respectively.

For example, as shown in FIG. 6A, the step S53 includes steps S601-S605 which will be described below with reference to FIGS. 1 and 2A.

Step S601: forming the gate electrode 202 of the photosensitive thin film transistor 220 and the second touch electrode layer 212 of the touch structure 21.

For example, referring to FIGS. 1 and 2A, the first conductive layer is formed and subjected to a patterning process to form the gate electrode 202 of the photosensitive thin film transistor 220 and the plurality of second connecting portions 121 arranged in the second direction D2 and spaced apart from each other.

For example, the first electrode 231 of the first capacitor 223 is also formed in the patterning process of the first conductive layer.

For example, the first conductive layer may be made of gold (Au), silver (Ag), copper (Cu), aluminum (Al), molybdenum (Mo), magnesium (Mg), tungsten (W), an alloy material of any combination thereof, or a conductive metal oxide material, such as indium tin oxide (ITO), indium zinc oxide (IZO), zinc oxide (ZnO), zinc aluminum oxide (AZO), or the like.

For example, a conventional photolithography technology may be adopted as the first patterning process, including steps of photoresist coating, exposing, developing, etching, photoresist stripping, or the like, which are not repeated herein.

Step S602: forming the gate insulating layer 203 of the photosensitive thin film transistor 220, and forming the active layer 204 and the etch stopping layer 207 at the gate insulating layer.

For example, a semiconductor layer and a first insulating layer are formed at the gate insulating layer 203 sequentially and subjected to a patterning process to form the active layer 204 and the etch stopping layer 207 which, for example, may be formed in the same patterning process.

Step S603: forming the source-drain electrode layer of the photosensitive thin film transistor 220.

For example, the second conductive layer is formed at the first insulating layer and subjected to a patterning process to form the source electrode 205 and the drain electrode 206 of the photosensitive thin film transistor 220.

For example, the second electrode 232 of the first capacitor 223 is also formed in the patterning process of the second conductive layer.

Step S604: forming the first light shielding layer 221 and the first touch electrode layer 211 of the touch structure 21.

For example, a second insulating layer is formed at the source-drain electrode layer and subjected to a patterning process to form the via hole at a position corresponding to the second connecting portion 121, and two ends of the second connecting portion 121 are exposed by the via hole which, for example, penetrates through the semiconductor layer as well as the first and second insulating layers.

For example, a third conductive layer is formed at the second insulating layer and subjected to a patterning process to form the first light shielding layer 221, the first touch electrode 11 extended along the first direction D1 and the plurality of second touch electrode portions 120 arranged along the second direction D2, and the second touch electrode portion 120 is electrically connected with the corresponding second connecting portion 121 through via hole in the second insulating layer, so as to form the second touch electrodes 12.

For example, each of the first touch electrode portion 110 and the second touch electrode portion 120 includes the grid structure exposing the photosensitive thin film transistor 220 and the light-emitting element 23.

In some other examples, referring to FIG. 2B, the first touch electrode layer 211 is formed together with the source-drain electrode layer of the photosensitive thin film transistor 220 in step S603. That is, the second conductive layer is subjected to the patterning process to form the first touch electrode 111, the second touch electrode portion 120 as well as the source and drain electrodes 205, 206 of the photosensitive thin film transistor 220.

For example, before formation of the above-mentioned second conductive layer, using a half-tone mask plate, in one patterning process, the active layer 204 and the etch stopping layer 207 are formed, and the via hole is formed at the position corresponding to the second connecting portion 121.

A manufacturing method of the touch structure and the photosensitive unit in the electronic substrate shown in FIG. 2B will be described below with reference to FIGS. 7A-7D, and for convenience of description, the portion below the passivation layer 104 is omitted in FIGS. 7A-7C.

Figure 7A:
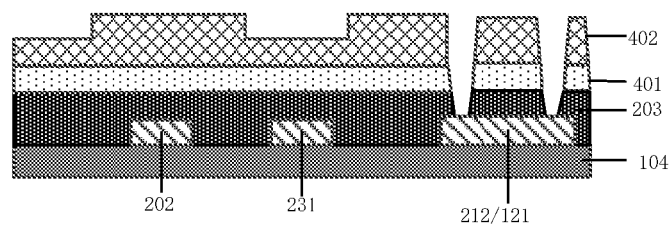
FIGS. 7A-7D are step views of the manufacturing method of the electronic substrate according to some embodiments of the present disclosure.

With reference to FIGS. 2B and 7A, the first conductive layer is formed at the passivation layer 104 and subjected to a patterning process to form the gate electrode 202 of the photosensitive thin film transistor 220, the second touch electrode layer 212 of the touch structure 21 and the first electrode 231 of the first capacitor 233, and the second touch electrode layer 212 includes the plurality of second connecting portions 121; then, the gate insulating layer 203 is formed at the first conductive layer, and a semiconductor layer 401 and a photoresist are formed at the gate insulating layer 203; the photoresist is exposed and developed using a half-tone mask plate to obtain a first etching mask 402 as shown in FIG. 7A, the semiconductor layer 401 and the gate insulating layer 203 are then etched using the first etching mask 402 to form the via hole at the position corresponding to the second connecting portion 121, and the two ends of the second connecting portion 212 are exposed by the via hole which penetrates through the semiconductor layer 401 and the gate insulating layer 203.

Figure 7B:
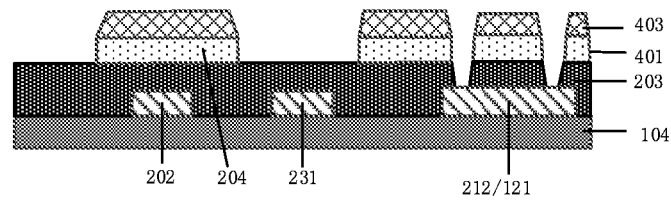

Referring to FIGS. 2B and 7B, the first etching mask 402 is subjected to a first ashing technology to form a second etching mask 403 as shown in FIG. 7B, and the semiconductor layer is subjected to an etching technology again using the second etching mask 403 to form the active layer 204 of the photosensitive thin film transistor 220.

Figure 7C:
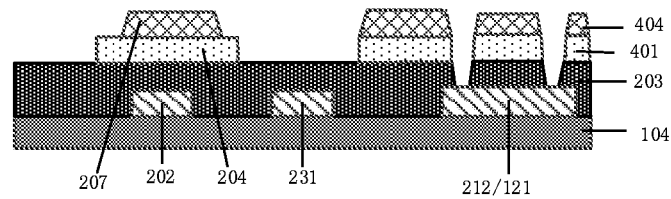

With reference to FIGS. 2B and 7C, the second etching mask 403 is subjected to a second ashing technology to form a photoresist pattern 404 as shown in FIG. 7C, a part of the photoresist pattern 404 located at the active layer 204 is formed as the etch stopping layer 207, and at least a part of the active layer 204 is exposed by the etch stopping layer 207 with the second ashing technology, such that the source-drain electrode layer which is formed subsequently comes into sufficient contact with the active layer 204. As such, the etch stopping layer 207 may be formed of a photoresist material, which only requires one additional ashing technology, and does not require additional materials and technological steps.

Figure 7D:
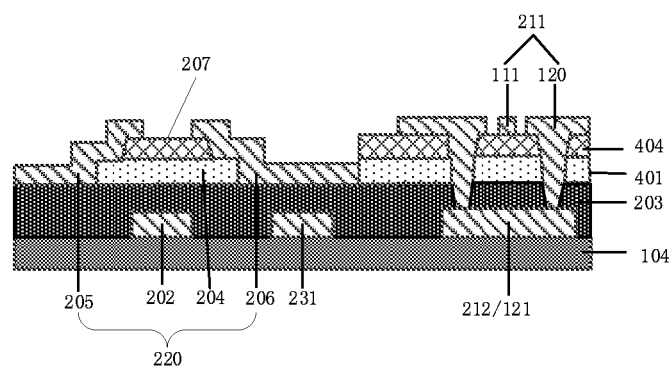

With reference to FIGS. 2B and 7D, the second conductive layer is formed at the photoresist pattern 404 and subjected to a patterning process to form the source-drain electrode layer (including the source and drain electrodes 205, 206) of the photosensitive thin film transistor 220 and the first touch electrode layer 211 which includes the first touch electrode 111 and the second touch electrode portion 120.

In still other examples, for example, as shown in FIG. 6B, the step S53 includes steps S611-S617 which will be described below with reference to FIGS. 1 and 3A.

Step S611: forming the source-drain electrode layer of the switching transistor 27.

For example, the first conductive layer is formed and subjected to a patterning process to form the source electrode 274 and the drain electrode 275 of the switching transistor 27.

For example, the second electrode 282 of the second capacitor 228 is also formed in the patterning process of the first conductive layer.

Step S612: forming the active layer 273 and the gate insulating layer 272 of the switching transistor 27.

For example, a semiconductor layer and a first insulating layer are formed at the first conductive layer sequentially to form the active layer 273 and the gate insulating layer 272.

Step S613: forming the gate electrode 271 of the switching transistor 27 and the second touch electrode layer 212.

For example, the second conductive layer is formed at the first insulating layer and subjected to a patterning process to form the gate electrode 271 of the switching transistor 27 and the plurality of second connecting portions 121 arranged in the second direction D2.

For example, the first electrode 281 of the second capacitor 228 is also formed in the patterning process of the second conductive layer.

Step S614: forming the first electrode of the photodiode and the first touch electrode layer of the touch structure.

For example, a second insulating layer is formed at the second conductive layer, and using a half-tone mask plate, in one patterning process, a first via hole is formed at a position corresponding to the drain electrode 275, and a second via hole is formed at a position corresponding to the second connecting portion 121; two ends of the drain electrode 275 and the second connecting portion are exposed by the first and second via holes respectively.

Then, a third conductive layer is formed at the second insulating layer and subjected to a patterning process to form the first electrode 261 of the photodiode 26, the first touch electrode 11 and the second touch electrode portion 120, the first electrode 261 is electrically connected with the drain electrode 275 through the first via hole, and the second touch electrode portion 120 is electrically connected with the second connecting portion 121 through the second via hole, so as to form the second touch electrode 12.

For example, the first lead 264, also formed in the patterning process of the third conductive layer, is configured to be connected with the second electrode 263 which is formed subsequently.

Step S615: forming the optical detection layer and the second electrode of the photodiode to form the photodiode.

For example, the second electrode 263 of the photodiode directly overlaps with the first lead 264 to form electric connection.

In still other examples, referring to FIG. 3B, the second touch electrode layer 212 is formed together with the source-drain electrode layer of the switching transistor 27 in step S611. That is, the above-mentioned first conductive layer is subjected to a patterning process to form the second connecting portion 121, the source and drain electrodes 274, 275 of the switching transistor 27, as well as the second electrode 282 of the second capacitor 228.

Step S54: forming the second encapsulation layer 107 at the photosensitive unit 22 and the touch structure 21, providing the polarizing layer 108, and attaching the cover plate 109.

The above described are only exemplary implementations of the present disclosure, and not intended to limit the protection scope of the present disclosure. The scope of the present disclosure is defined by the appended claims.

What is claimed is:

1. An electronic substrate, comprising:
    a base substrate, and
    a photosensitive unit and a touch structure which are provided on the base substrate,
    wherein the photosensitive unit comprises a first electrode layer, and the touch structure comprises a first touch electrode layer;
    the first electrode layer and the first touch electrode layer are in a same first conductive layer and made of a same material, and the first electrode layer and the first touch electrode layer are insulated from each other;
    the touch structure further comprises a second touch electrode layer in a different layer from the first conductive layer; and
    the photosensitive unit further comprises a second electrode layer, the second electrode layer is in a same layer and made of a same material as the second touch electrode layer, and the second electrode layer is insulated from the second touch electrode layer;
    the photosensitive unit comprises a photosensitive thin film transistor and a first light shielding layer at a side of the photosensitive thin film transistor away from the base substrate, and the first light shielding layer is provided with a first opening;
    the photosensitive thin film transistor comprises a gate electrode, an active layer, a source electrode and a drain electrode, the gate electrode of the photosensitive thin film transistor is at a side of the active layer close to the base substrate, and the first opening at least partially overlaps with the active layer of the photosensitive thin film transistor in a direction perpendicular to the base substrate; and the first light shielding layer and the gate electrode of the photosensitive thin film transistor serve as the first electrode layer and second electrode layer respectively.

2. The electronic substrate according to claim 1, wherein the first touch electrode layer comprises a first touch electrode extended in a first direction and a plurality of second touch electrode portions arranged in a second direction;

the second touch electrode layer comprises a plurality of second connecting portions, and the plurality of second connecting portions and the plurality of second touch electrode portions are alternately electrically connected to form a second touch electrode extended in the second direction; and the second direction intersects with the first direction.

3. The electronic substrate according to claim 1, wherein the photosensitive thin film transistor further comprises an etch stopping layer at a side of the active layer away from the base substrate.

4. The electronic substrate according to claim 1, wherein the photosensitive unit further comprises a first capacitor, and the first capacitor comprises a first electrode and a second electrode;

the first electrode of the first capacitor is in a same layer and made of a same material as the gate electrode of the photosensitive thin film transistor, and the first electrode of the first capacitor is insulated from the gate electrode of the photosensitive thin film transistor; and the second electrode of the first capacitor is in a same layer as and is electrically connected with the drain electrode of the photosensitive thin film transistor.

5. The electronic substrate according to claim 1, further comprising a light-emitting element on the base substrate, wherein the photosensitive unit and the touch structure are both at a side of the light-emitting element away from the base substrate.

6. The electronic substrate according to claim 5, wherein the first touch electrode layer comprises a metal material, and the first touch electrode layer further comprises an opening to expose at least a part of the light-emitting element.

7. The electronic substrate according to claim 1, wherein the first touch electrode layer comprises a plurality of metal grids formed by a plurality of metal wires; and an orthographic projection of the first electrode layer at the base substrate is located within an orthographic projection of a mesh hole of one of the plurality of metal grids at the base substrate.

8. A display panel, comprising the electronic substrate according to claim 1.

9. The display panel according to claim 8, wherein the display panel further comprises a plurality of sub-pixels on the base substrate and arranged in an array in a first direction and a second direction, and the first direction is different from the second direction; and the photosensitive unit and the touch structure are both at a side of each of the plurality of sub-pixels away from the base substrate.

10. The display panel according to claim 9, wherein the display panel further comprises a pixel defining layer, each of the plurality of sub-pixels comprises a light-emitting element, and the pixel defining layer comprises a plurality of openings for respectively exposing a plurality of light-emitting elements to define a plurality of pixel opening areas of the plurality of sub-pixels; and an orthographic projection of all conductive patterns in the first conductive layer at the base substrate is located outside orthographic projections of the plurality of pixel opening areas of the plurality of sub-pixels at the base substrate.

11. The display panel according to claim 10, wherein the plurality of sub-pixels are divided into a plurality of repeated units, and each of the plurality of repeated units comprises one red sub-pixel, one blue sub-pixel and two paired green sub-pixels;

the pixel opening areas of the two paired green sub-pixels are arranged in parallel in the second direction; and an orthographic projection of the photosensitive unit at the base substrate is located between an orthographic projection of the opening area of the red sub-pixel at the base substrate and orthographic projections of the opening areas of the two paired green sub-pixels at the base substrate, and the orthographic projection of the opening area of the red sub-pixel is adjacent from the orthographic projections of the opening areas of the two paired green sub-pixels in the first direction.

12. An electronic substrate, comprising:

a base substrate, and a photosensitive unit and a touch structure which are provided on the base substrate, wherein the photosensitive unit comprises a first electrode layer, and the touch structure comprises a first touch electrode layer;

the first electrode layer and the first touch electrode layer are in a same first conductive layer and made of a same material, and the first electrode layer and the first touch electrode layer are insulated from each other;

the touch structure further comprises a second touch electrode layer in a different layer from the first conductive layer; and the photosensitive unit further comprises a second electrode layer, the second electrode layer is in a same layer and made of a same material as the second touch electrode layer, and the second electrode layer is insulated from the second touch electrode layer;

the photosensitive unit comprises a photosensitive element and a switching transistor which is connected with the photosensitive element, and the photosensitive element is at a side of the switching transistor away from the base substrate;

the photosensitive element comprises a first electrode, a second electrode and a photosensitive layer located between the first electrode and the second electrode, the switching transistor comprises a gate electrode, an active layer, a source electrode and a drain electrode, and the drain electrode of the switching transistor is electrically connected with the first electrode of the photosensitive element; and the first electrode of the photosensitive element and the gate electrode of the switching transistor serve as the first electrode layer and second electrode layer respectively.

13. The electronic substrate according to claim 12, further comprising a first light shielding layer, wherein the first light shielding layer and the gate electrode of the switching transistor are at two opposite sides of the active layer of the switching transistor in a direction perpendicular to the base substrate, and the first light shielding layer overlaps with the active layer of the switching transistor in the direction perpendicular to the base substrate.

14. A manufacturing method of an electronic substrate, comprising:
    forming a photosensitive unit and a touch structure at a base substrate,
    wherein forming the photosensitive unit comprises forming a first electrode layer, and
    forming the touch structure comprises forming a first touch electrode layer,
    wherein the first electrode layer and the first touch electrode layer are formed in a same patterning process and are insulated from each other;
    forming the touch structure further comprises forming a second touch electrode layer,
    forming the photosensitive unit further comprises forming a second electrode layer, and the second electrode layer and the second touch electrode layer are formed in a same patterning process and are insulated from each other; and
    the photosensitive unit comprises a photosensitive thin film transistor and a first light shielding layer at a side of the photosensitive thin film transistor away from the base substrate, and the first light shielding layer is provided with a first opening;
    the photosensitive thin film transistor comprises a gate electrode, an active layer, a source electrode and a drain electrode, the gate electrode of the photosensitive thin film transistor is at a side of the active layer close to the base substrate, and the first opening at least partially overlaps with the active layer of the photosensitive thin film transistor in a direction perpendicular to the base substrate; and
    the first light shielding layer and the gate electrode of the photosensitive thin film transistor serve as the first electrode layer and second electrode layer respectively.

15. The manufacturing method according to claim 14, wherein
    the manufacturing method further comprises forming a light-emitting element at the base substrate before formation of the photosensitive unit and the touch structure.

\* \* \* \* \*